United States Patent
Takano et al.

[19]

[11] Patent Number: 5,870,668
[45] Date of Patent: Feb. 9, 1999

[54] AMPLIFIER HAVING DISTORTION COMPENSATION AND BASE STATION FOR RADIO COMMUNICATION USING THE SAME

[75] Inventors: Takeshi Takano; Yasuyuki Oishi; Eisuke Fukuda; Hideto Furukawa; Kazuo Nagatani, all of Kawasaki, Japan

[73] Assignee: Fujitsu Limited, Kanagawa, Japan

[21] Appl. No.: 688,443

[22] Filed: Jul. 30, 1996

[30]   Foreign Application Priority Data

Aug. 18, 1995 [JP] Japan .................................... 7-210870
Aug. 31, 1995 [JP] Japan .................................... 7-224169

[51] Int. Cl.$^6$ ................................................. H04B 7/0005
[52] U.S. Cl. ......................................... 455/126; 455/295
[58] Field of Search .................................. 455/126, 295; 330/149

[56]         References Cited

U.S. PATENT DOCUMENTS

| | | | |
|---|---|---|---|
| 5,507,017 | 4/1996 | Whitmarsh | 455/126 |
| 5,574,992 | 11/1996 | Cygan | 455/126 |
| 5,579,342 | 11/1996 | Crozier | 330/149 |
| 5,722,056 | 2/1998 | Horowitz | 455/126 |

OTHER PUBLICATIONS

Adaptive Filter Theory Second Edition 1991 by Prentice-Hall, Inc.; Simon Haykin; Chaps. 9 and 13.

*Primary Examiner*—Howard Britton
*Attorney, Agent, or Firm*—Helfgott & Karas, P.C.

[57]           ABSTRACT

A amplifier having distortion compensation is employed as a power amplifier for amplifying a linear modulated signal or a low noise amplifier for amplifying a linear modulated signal. The amplifier having distortion compenssation includes an amplifier circuit for amplifying an input signal; an error detecting circuit for obtaining an error signal between the input signal to and an output signal from the amplifier circuit; a coefficient generating circuit for generating compensation coefficients to compensate distortion components of characteristics of the amplifier circuit, based on the error signal according to an adaptive type algorithm; a first outputting circuit for outputting a generated compensation coefficient corresponding to the input signal; and a multiplying circuit for multiplying the generated compensation coefficient to the input signal and inputting a multiplied coefficient to the amplifier circuit.

43 Claims, 46 Drawing Sheets

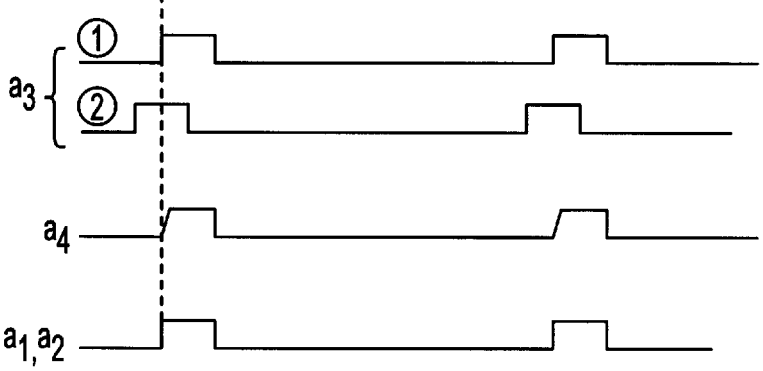
FIG. 27A CL
FIG. 27B $a_0$
FIG. 27C $a_3$ ① ②
FIG. 27D $a_4$
FIG. 27E $a_1, a_2$

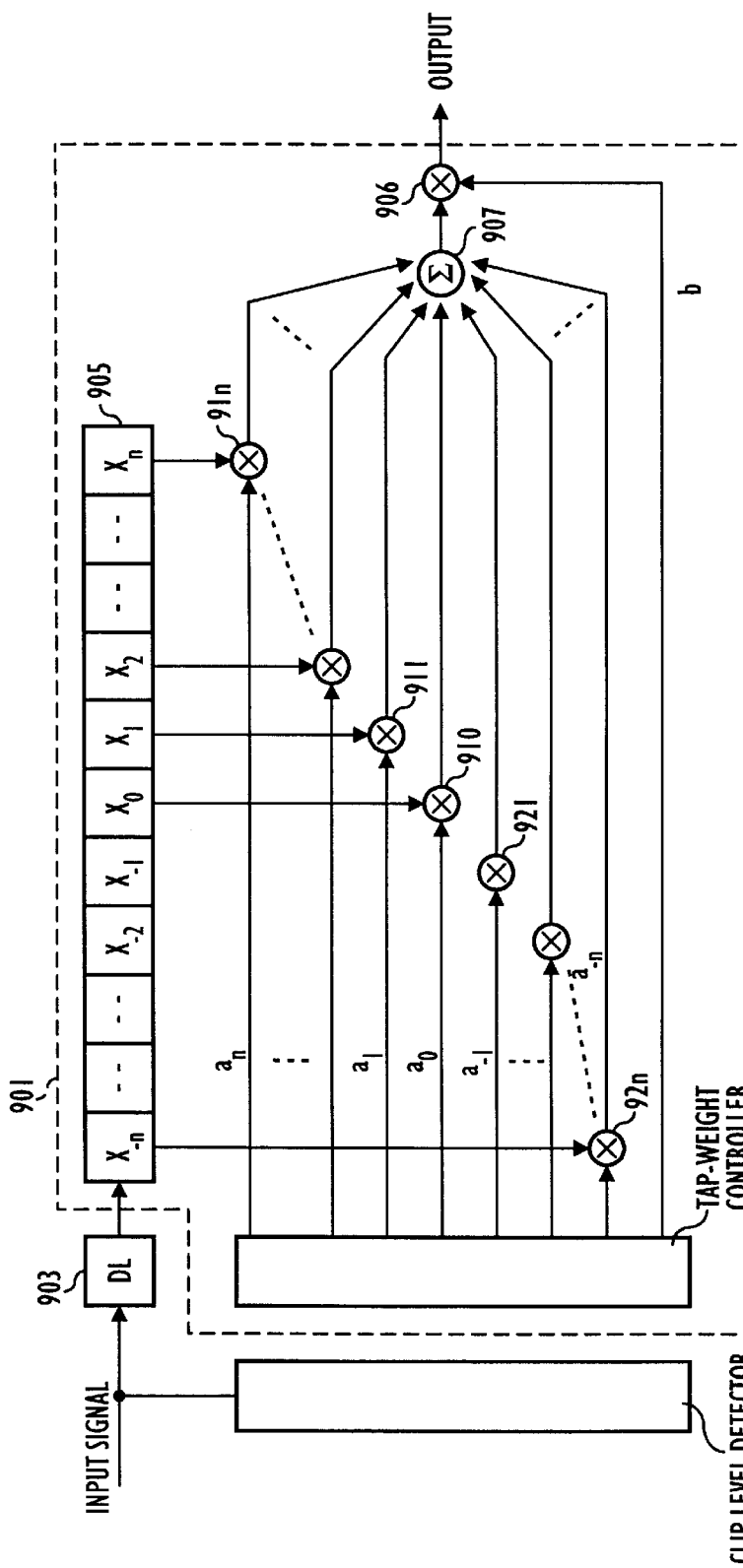
FIG. 40A
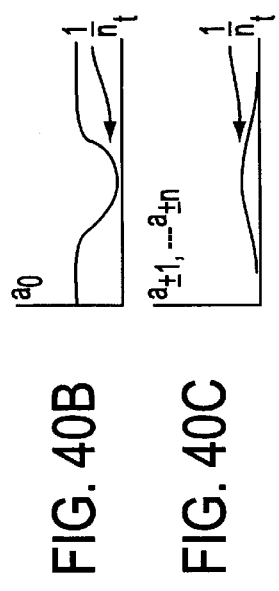
FIG. 40B
FIG. 40C

AMPLIFIER HAVING DISTORTION COMPENSATION AND BASE STATION FOR RADIO COMMUNICATION USING THE SAME

BACKGROUND OF THE INVENTION

1. Field of the Invention

The present invention relates to an amplifier having distortion compensation, and more particularly to an amplifier, which is employed as a power amplifier for amplifying a linear modulated signal or a low-noise amplifier for receiving and amplifying a linear modulated signal. Further, the present invention relates to a structure of a base station for radio communication using the amplifier, which performs distortion compensation.

2. Description of the Related Art

Recently, there is a demand for employing an amplifier having high linear characteristics as a power amplifier to amplify linear modulated signals or as a low-noise amplifier employed in a receiver, which receives linear modulated signals, in order to suppress deterioration in transmission characteristics caused by spectrum characteristics or distortion of transmitted signals.

In many applications, amplifiers are also required to have high power efficiency. However, it is generally understood that linearity and efficiency of an amplifier be contradictory to each other. To satisfy both characteristics, various kinds of distortion compensating methods have been proposed.

A pre-distorter is well-known as one of the distortion compensating methods. A principle of the pre-distorter is to obtain a desired signal, of which distortion is removed, from an output of an amplifier by previously adding a characteristic reversed to the distortion characteristic of the amplifier to an input signal of the amplifier.

FIG. 1 shows a structural block diagram of a conventional pre-distorter. In FIG. 1, reference numeral 1 is a power amplifier, which amplifies an output signal from an orthogonal modulator 2. Compensation values $\Delta I_0$ and $\Delta Q_0$ sent from a distortion compensating table 8 are added to input base band signals I and Q in adders 6, respectively, and inputted to the orthogonal modulator 2. Orthogonal modulated signals are amplified in the power amplifier 1, and are added with distortion caused by a characteristic of the amplifier. However, the distortion can be removed by the compensating values $\Delta I_0$ and $\Delta Q_0$.

A part of the output signal of the amplifier 1 is modulated in an orthogonal demodulator 3 to obtain the base band signals I' and Q'. Then, a phase shifter 5 adjusts a phase of a local oscillating signal for demodulation sent from a local oscillator 4 so as to coincide phases of the base band signals I' and Q' with those of the input signals I and Q.

Comparators 7 compare the obtained signals I' and Q' with the input base band signals I and Q, and obtain $\Delta I_1$ and $\Delta Q_1$ for updating the values of the distortion compensating table 8 according to differences between those signals, and $\Delta I_1$ and $\Delta Q_1$ are then stored in the distortion compensating table 8.

In the above-described conventional method, the distortion of the amplifier 1 is obtained as an error of each component in an orthogonal coordinate group. Therefore, pre-distortion is performed by adding the characteristic reversed to that of the obtained distortion to each axis component.

However, there are some problems in the conventional method as follows;

(a) It is required for the distortion compensating table 8 to have compensating values for every points on the two-dimensional plane, expressed by the input signals I and Q, since there are included two distortions of amplitude and phase in the distortion of the amplifier 1. Therefore, $2^{2n} \times n$ bits are required as storage capacity of the distortion compensating table 8, in the case where the quantized bit number of the input signals I and Q is n bits.

(b) Meanwhile, in a method for performing distortion compensation in a polar coordinate group, the compensating table 8 is formed in one-dimensional plane. However, when interfacing to the orthogonal modulator 2 and the orthogonal demodulator 3, conversion arithmetics for converting from a polar coordinate group to an orthogonal coordinate group, or an orthogonal coordinate group to a polar coordinate group is required.

(c) The base band input signals I and Q should have the same phases as the demodulated signals I' and Q'. Therefore, it is required to provide a phase shifter 5 for adjusting local phases of an orthogonal detector, which is an orthogonal demodulator 3. Further, a quantity of phase rotation of the amplifier 1 varies according to operation temperature and operation period. Then, a function for keeping its condition the best is required to adaptively make the local phase respond to the operation.

(d) Further, generation of delay in an amplifier or a filter causes time lag between the input signals I and Q and the demodulated signals I' and Q'. Therefore, the error signal, which is added from the distortion compensating table 8 to an input signal is not optimum for the input signal, and then, the characteristic of a linearizer deteriorates.

Meanwhile, in radio communication devices used for mobile communication, a plurality of carrier signals are commonly power-amplified in a radio frequency band, in order to perform signal transmission and the transmission of multiplied signals. Therefore, a power amplifier having good linearity is desired as the above-described power amplifier, in order to suppress deterioration of transmission characteristics.

The power amplifier having better linearity, for example, a feed forward type amplifier, has weak points, such as large scale, large consumptive power, and high cost of the device. However, there is a possibility of improving a compact device having high power efficiency with low-cost, if the distortion compensation of the power amplifier can be realized by digital signal processing.

In this case, A/D and D/A converters are indispensable. However, it is difficult to have A/D and D/A convertors, which have sufficient operation speed, and a desired accuracy (number of bits). Currently, maximum output and input frequencies are several 10 MHz, and it is necessary to employ a convertor, if a communication device is used in a frequency band at much exceeding 10 MHz.

SUMMARY OF THE INVENTION

Accordingly, it is an object of the present invention to provide a distortion compensating amplifier to solve the above-described problems in the prior art.

It is another object of the present invention to provide a distortion compensating amplifier for reducing a capacity of a distortion compensating table.

It is still another object of the present invention to provide an amplifier having a distortion compensating function without arithmetic for converting from a polar coordinate group to an orthogonal coordinate group or an orthogonal coordinate group to a polar coordinate group.

It is a further object of the present invention to provide a distortion compensating amplifier, which has less characteristic change in the elapse of time.

It is a still further object of the present invention to provide a base station for radio communication, which makes it easy to suppress useless side band signals by employing an image rejection type frequency convertor as an up-convertor and a down-convertor required when the above-described distortion compensating amplifier is employed as a power amplifier.

A further object of the present invention is to provide a base station for radio communication having a distortion compensating amplifier, which increases a handling power by 3 dB, and more particularly, a compact type base station for radio communication, which is suitable for mobile communication.

It is required to have a 90 degree phase shifter in the image rejection type frequency convertor. However, wide frequency band makes it difficult to produce a frequency convertor with a passive circuit. Accordingly, it is a still further object of the present invention to provide a base station for radio communication, which can realize the passive circuit easily by employing a digital signal circuit.

Other objects of the present invention become clearly by the description for explaining embodiments according to the attached drawings.

BRIEF DESCRIPTION OF THE DRAWINGS

FIGS. 27A through FIG. 27E are time charts of timings shown in FIG. 25.

FIGS. 40A through 40C show structural examples of a clip level detector and smoothing circuit.

DESCRIPTION OF THE PREFERRED EMBODIMENTS

Figure 1:
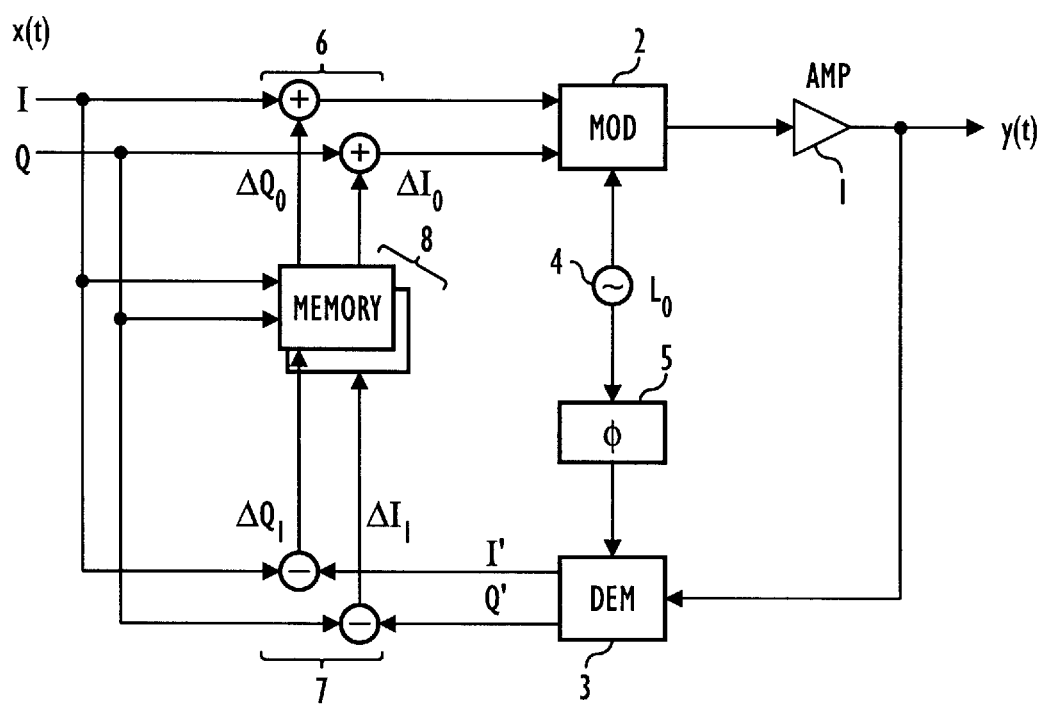
FIG. 1 shows a conventional amplifier having distortion compensation.

Hereinafter, embodiments of the present invention will be explained in accompanying the drawings. Throughout the following descriptions, the same reference numerals are used to denote and identify corresponding or identical components. To better understand the present invention, referring to FIG. 2, a principle diagram of an amplifier having distortion compensation according to the present invention is first explained.

Figure 2:
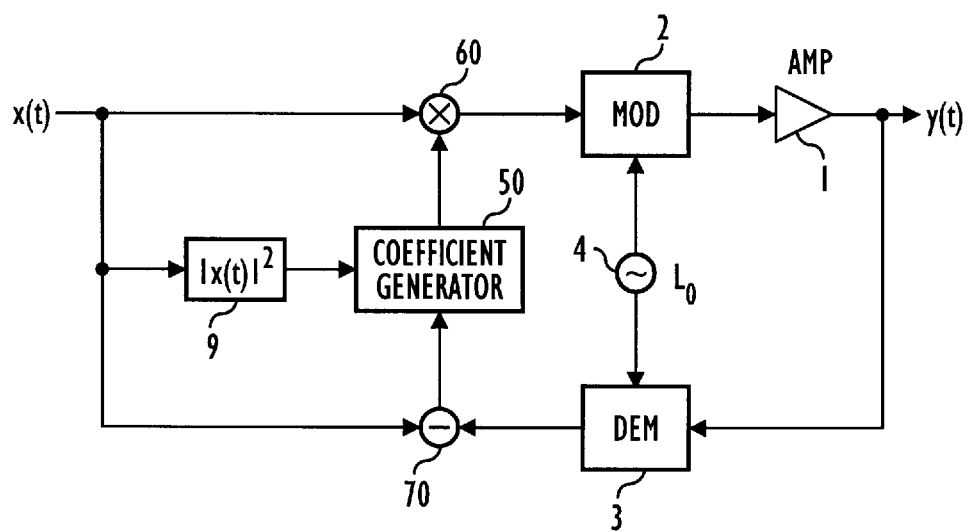
FIG. 2 shows a principle of an amplifier having distortion compensation according to the present invention.

In FIG. 2, reference numerals 1, 2, 3 and 4 are respectively a power amplifier, an orthogonal modulator, an orthogonal demodulator and a local oscillator, similarly to those shown in FIG. 1. Further, it is supposed that all base band signals are complex signals in FIG. 2. A multiplier 60 multiplies a base band input signal X(t) with a distortion compensating coefficient output from an estimated compensating coefficient generator 50 which uses adaptive type algorithm.

Then, the estimated compensating coefficient generator 50 using an adaptive type algorithm outputs a distortion compensating coefficient corresponding to an amplitude of the base band input signal, which is a feature of an amplifier having distortion compensation according to the present invention. The distortion compensating coefficient is a function of amplitude and phase distortions of the amplifier 1. Accordingly, the estimated compensating coefficient generator 50 using the adaptive type algorithm has the distortion compensating coefficient corresponding to the amplitude, and power of an input signal of a function of the amplitude and the power.

The amplitude and phase distortions of the amplifier 1 in a certain amplitude can be expressed as one complex value. Therefore, the multiplier 60 multiplies complex coefficients corresponding to each amplitude with the input base band signal X(t) as a distortion compensating coefficient, in order to perform pre-distortion.

In the present invention, further, an adaptive algorithm is employed for estimation of the distortion compensating coefficients. An example of the adaptive algorithm will be explained later. It is also possible to update the content of the estimated compensating coefficient generator 50 using the adaptive type algorithm and perform multiplication of distortion compensating coefficient for the input signal, independently with time-differential, at need.

In FIG. 2, a generator 9 generates an access signal for the estimated compensating coefficient generator 50 by corresponding adaptive type algorithm, according to any parameter, that is, the power and the amplitude of the input signal or the function thereof is coincided to the distortion compensating coefficients inputted to the multiplier 60.

According to the above-described principle, it is a feature of the present invention to employ a distortion compensating method of estimating non-linear distortion of the amplifier 1 by using the adaptive algorithm and of performing pre-distortion on the estimated non-linear distortion by digital processing. As the distortion is non-linear function of the input amplitude, the distortion is independently estimated for each value for function of a quantized input signal.

Then, a compensating value, which minimizes an error between an output signal and a reference signal, that is, an input signal, is obtained by the adaptive algorithm. More particularly, in the present invention, the estimated compensating coefficient generator 50 can have one-dimensional distortion compensating table, because the values accumulated in the estimated compensating coefficient generator 50 using the adaptive type algorithm corresponds to the input amplitude and input power. Therefore, the memory capacity of the estimated compensating coefficient generator 50 is reduced to $2^n \times n$ bits.

The memory capacity value is the same as $\frac{1}{2}^n$ of the conventional method. The capacity of the distortion compensating table means to what extent of a broken line graph the non-linear distortion characteristic of the amplifier 1 is close. If resolving power of the distortion estimation can be less than the quantized bit number of the modulated signal, it is further possible to reduce the memory capacity of the estimated coefficient generator 50.

As shown in FIG. 2, in comparison with FIG. 1, described above, it becomes needless to convert a polar coordinate to an orthogonal coordinate or an orthogonal coordinate to a polar coordinate.

Then, it also becomes needless to adjust a local phase of the demodulator. As the characteristic reverse to the distortion of the amplifier 1 is added by multiplying the complex distortion compensating coefficients, the amplifier 1 according to the present invention has a function of adjusting the phase rotation from 0 to $2\pi$.

Further, as the distortion compensating coefficient is estimated by the adaptive algorithm, it becomes always possible to give suitable pre-distortion without adjusting demodulated phase against changing in time of the demodulated phase.

If updating of the estimated compensating coefficient generator 50 is independently performed from the multiplication to the input signal, it becomes possible to always give suitable pre-distortion with no influence on a circuit loop.

There are various kinds of well-known adaptive algorithms. For example, one of the algorithms is explained in a book titled as "An introduction to an adaptive filter" published by Gendai-Kogaku-sha (issued on Sep. 10, 1987), which is written by S. Haykin.

Then, an embodiment of the present invention when employing Least Mean Squares (LMS) algorithm and Index weighted serial Recursive Squares (RLS) algorithm will be explained as follows;

It is considered as the Least Mean Squares (LMS) algorithm that, for example, a set of the input signals is closely with a smooth carved line, which defines the input signals on the times t1, t2 . . . tn as u(1), u(2) . . . u(n), and x(ti)=u(i) i=1, 2, . . . n. It is an outline of the LMS to make a square-law sum of the difference between the input signals u(i) and x(ti) to minimum, when the set approximates.

Figure 3:
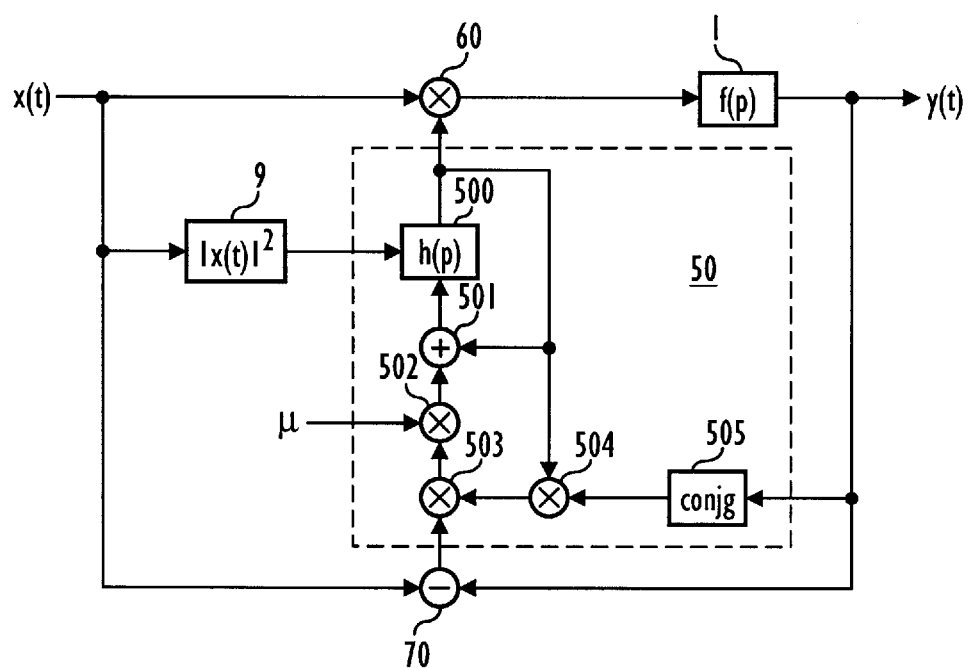
FIG. 3 shows a block diagram of a first embodiment of an amplifier having distortion compensation according to the present invention.

(a) An example of performing by the use of the LMS algorithm:

FIG. 3 shows a block diagram of a first embodiment according to the present invention. The modulator and the demodulator indicated in FIG. 1 are not shown to simplify the explanation in the embodiments of FIG. 3 or later. In FIG. 3, a circuit, which generates the distortion compensating coefficient estimated by the adaptive algorithm, i.e., the estimated compensating coefficient generator 50, comprises a table 500 for storing the distortion compensating coefficients, an adder 501, multipliers 502, 503, 504, and a complex number convertor 505.

Then, estimation of the distortion quantity to be compensated in FIG. 3 will be performed by the equations (1) to (6) as follows;

$$h_n(p)=h_{n-1}(p)+\mu e(t)u^*(t) \quad (1)$$

$$e(t)=x(t)-y(t) \quad (2)$$

$$u(t)=x(t)f(p)-h^*_{n-1}(p)y(t) \quad (3)$$

$$h_{n-1}(p)h^*_{n-1}(p)-1 \quad (4)$$

$$y(t)=h_{n-1}(P)x(t)f(p) \quad (5)$$

$$p=|x(t)|^2 \quad (6)$$

where x(t) is an input base band signal, f(p) is a distortion function of the amplifier 1, h(p) is an estimated distortion compensating coefficient to be updated, and $\mu$ is a step size parameter. Further, in the above-described equations (1) through (6), x, y, f, h, u, and e are complex numbers, and * expresses a conjugate complex number. Further, u(t) is approximated as $(h_{n-1}(p)h^*_{n-1}(p)-1)$, which means that amplitude distortion of the amplifier 1 is not too large.

On the above-described condition, the meanings of the contents of the equations (1) to (6) will be explained. $h_n(p)$ is the estimated distortion compensating coefficient to be updated, which is an input to the table 500 for storing the distortion compensating coefficients. A complex number convertor 505, i.e., a conjugate complex number generator, obtains y*(t) from the output y(t) of the amplifier 1. Accordingly, if the estimated distortion compensating coefficients before a certain point is $h_{n-1}(p)$, the output of the multiplier 504 becomes to y*(t) $h_{n-1}(p)$.

The multiplier 503 multiplies the output of the multiplier 504 with the output e(t) of a subtracter 70, so that the output becomes to y*(t) $h_{n-1}(p)e(t)$. Further, the multiplier 502 multiplies a step size parameter $\mu$ to the result of y*(t) $h_{n-1}(p)e(t)$.

Accordingly, the estimated distortion compensation coefficient to be updated $h_n(p)$ becomes as follows;

$$h_n(p)=\mu y^*(t)h_{n-1}(p)e(t)+h_{n-1}(p)$$

If y*(t) $h_{n-1}(p)=U_*(t)$, it is expressed as the equation (1).

e(t) is an output of the subtracter 70 as shown in the equation (2), and it is an error between the input and the output. Further, u(t) shown in the equation (3), of which amplitude distortion of the amplifier 1 is not too large, is approximated by supposing as the equation (4). Accordingly, the conjugate complex number U(t) of U*(t) can be expressed as the equation (3).

The equation (6) means that the circuit 9 obtains the size of power of the input signal. When the circuit 9 is employed as a circuit for obtaining the amplitude of the input signal, the equation (6) is expressed by $|x(t)|$. Further, when the equation (6) is employed as function of power or amplitude, the equation is expressed as $g(|x(t)|^2)$ or $g(|x(t)|)$, respectively.

The values obtained by the circuit 9 become addresses when writing or reading to/from the table 500 for storing the distortion compensating coefficients.

When updating to write to the table 500 and the multiplication of the estimated distortion compensating coefficient to the input signal are performed respectively, it is possible to regularly perform pre-distortion without influence of delay to the group.

Figure 4:
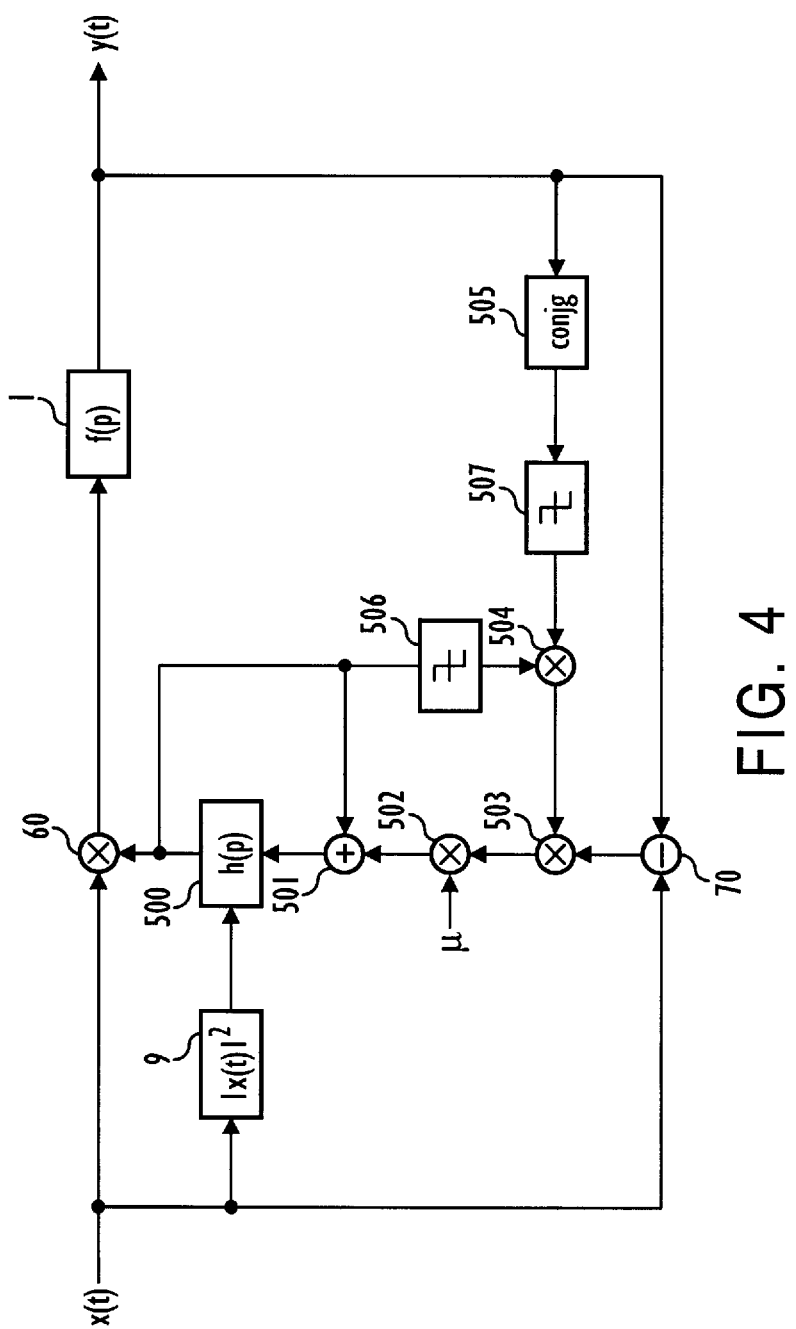
FIG. 4 shows a block diagram of a second embodiment of an amplifier having distortion compensation according to the present invention.

(b) An example of performing by the use of a clipped LMS algorithm:

In FIG. 3, it is required for updating $h_n(p)$ to multiply complex numbers for two times (multiplication in the multipliers 503 and 504) and multiply real numbers for one time (multiplication with $\mu$ in the multiplier 502) in the arithmetic on the equalization (1). FIG. 4 shows a block diagram of a second embodiment of the present invention to reduce the times of multiplications.

More particularly, FIG. 4 shows an extended example of FIG. 3, described above, in which distortion compensating coefficients are estimated according to the adaptive algorithm employing quadrant information of the demodulated complex signals. The structure shown in FIG. 4 has quadrant detectors 506 and 507 and multipliers 503 and 504 as phase rotating units, in addition to the structure of the embodiment shown in FIG. 3.

On such a structure, the above-described equation (1) is replaced to the equation (7) as follows.

$$h_n(p) = h_{n-1}(p) + \mu e(t)det[h_{n-1}(p)]det[y(t)^*] \quad (7)$$

$$det[R + jX] = \frac{1}{\sqrt{2}}(sgn(R) + jsgn(X))$$

$$sgn(X) = \begin{matrix} 1(X \geq 0) \\ -1(x < 0) \end{matrix}$$

To realize the equation (7), the multiplication of $\mu$ should be performed with bit shifting as $\mu=\frac{1}{2}^n$ in the circuit shown in FIG. 4. Therefore, a second member in the right side of the equation (7) becomes a rotation arithmetic of 0, $\pm\pi/2$, $\pi$ for e(t). The multipliers 503 and 504 are formed of a hardware circuit, which includes a convertor for conversion of positive/negative codes and a selector.

Further, quadrant detectors 506 and 507, which are composed of comparing units for comparing each of the imaginary and real parts as employing 0 as a center, obtain sgn (R) and sgn (X) shown in the above-described equation (7). When the input complex signal is larger than 0, 1 is outputted. When the input complex signal is less than 0, −1 is outputted. Therefore, the demodulated complex signal can be expressed with 4 bits, showing in which one of the four quadrants the demodulated complex signals are positioned.

(c) An example of performing with the use of index weighted Recursive Least Squares algorithm.

Figure 5:
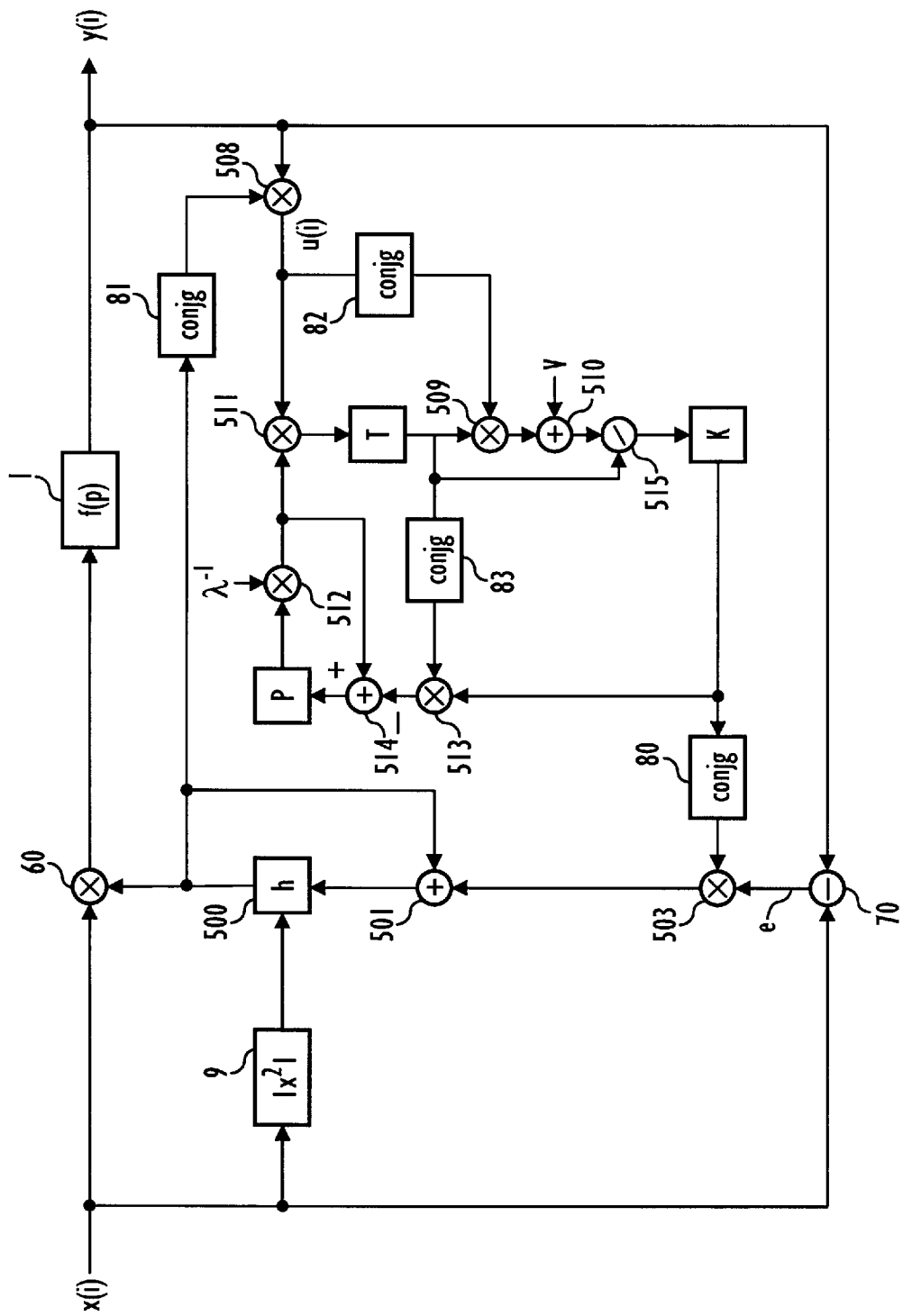
FIG. 5 shows a block diagram of a third embodiment of an amplifier having distortion compensation according to the present invention.

FIG. 5 shows a structural block diagram of an example with the use of index weighted Recursive Least Squares as an adaptive algorithm.

The arithmetics for obtaining estimated distortion compensating coefficients with the use of the adaptive algorithm corresponding to the above-described embodiment are given as shown in the equations (8) to (11).

$$h(i) = h(i - 1) + e(i)K^*(i) \quad (8)$$

$$K(i) = \frac{T(i)}{V + u^*(i)T(i)} \quad (9)$$

$$P(i) = \lambda^{-1}P(i - 1) - K(i)T^*(i) \quad (10)$$

$$T(i) = \lambda^{-1}P(i - 1)u(i)$$
$$e(i) = x(i) - y(i) \quad (11)$$

The estimated distortion compensating coefficient h(i) shown in the equation (8), which is updated in the table 500 for storing the distortion compensating coefficients, is made by adding the value, which is obtained by multiplying the error signal e(i) obtained from the subtracter 70 with conjugate value K* of K, which is obtained from the conjugate complex number convertor 80, to the distortion compensating coefficient h(i−1) before a certain point in the adder 501.

K is so-called as Kalman vector, which is obtained according to the above-described equation (9). on the denominator of the equation (9), v means a variance of estimated error e(i), which is a small positive integer, for example, 1. u*(i) is an output of the conjugate complex number convertor 82. u(i) is obtained from the conjugate complex number convertor 81 and the multiplier 508, which is an approximate value expressed, similarly to the above-described equation (3).

Consequently, the multiplier 509 obtains the product between u*(i) and T(i). The adder 510 adds v to the product. It becomes the denominator of the equation (9).

Meanwhile, T(i), which is the numerator of the equation (9), becomes the relationship shown in the equation (11). Then, P(i−1) expressed in the equation (11) has the relationship shown in the equation (10). P(i) in the equation (10) is so-called a correlation matrix in the present algorithm.

T(i) means an output of the multiplier 511, which is expressed with the product of u(i) and $\lambda^{-1}$ P(i−1), which is an output of the multiplier 512. Further, P(i) is the result of subtracting the output of the multiplier 513, i.e., the product of u*(i) obtained from the conjugate complex number convertor 83 and the Kalman coefficient K, from the output of the multiplier 512, i.e., the product of p(i−1) and the reciprocal of $\lambda$, $\lambda^{-1}$, in the subtracter 514.

The above-described $\lambda$ is an foregetting factor, which be in $0<\lambda \leq 1$. When $\lambda$ is 1, the value P(i) is accumulated to $\lambda$. When the value becomes close to 0, the passed values are erased, i.e., lost. That brings the result of delaying convergence, when the characteristic of the amplifier varies in time or temperature, or all of the passed values are accumulated. Accordingly, it is general to select an adaptive value being close to 0.9 as optimal.

Returning back to FIG. 5, a divider 515 performs the arithmetic by employing the output of the adder 510 as a denominator and T(i) as a numerator. According to the arithmetic, a Kalman vector K of the equation (9) can be obtained.

Figure 6:
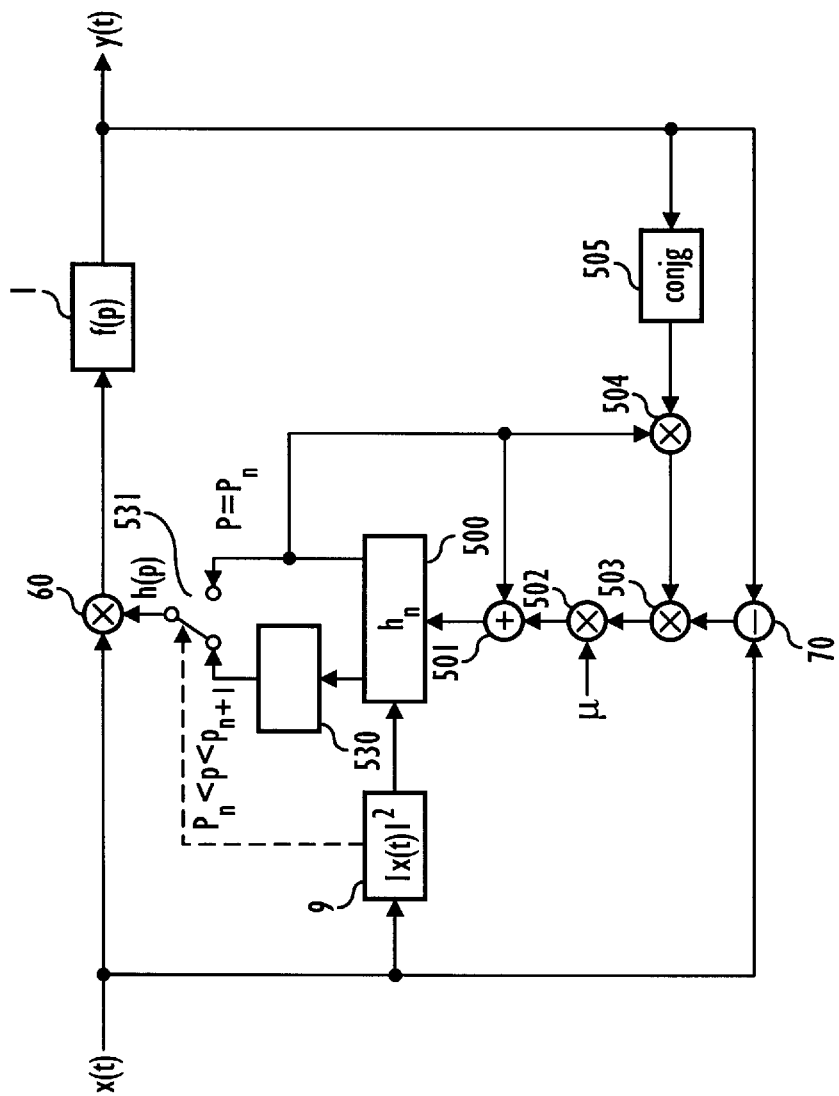
FIG. 6 shows a block diagram of a fourth embodiment of an amplifier having distortion compensation according to the present invention.

FIG. 6 shows a block diagram of a fourth embodiment of the present invention. More particularly, in the embodiment, capacity of the table 500 for storing the distortion compensating coefficient can be reduced. It is the premise that the reduction of the capacity of the table 500 is applied to a structure with the use of LMS algorithm shown in FIGS. 3 and 4, however, it is not restrictive, and it is also possible to apply to the embodiment with the use of RLS algorithm shown in FIG. 5.

Figure 7:
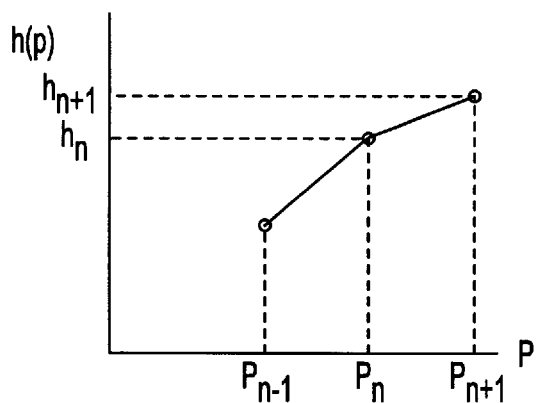
FIG. 7 is an explanatory diagram of the operation of the fourth embodiment shown in FIG. 6.

FIG. 7 is an explanatory diagram of the operation of the embodiment shown in FIG. 6. In the embodiment of FIG. 6, the estimated distortion compensating coefficient is obtained and interpolated according to the arithmetic of obtaining the adjoining estimated value based on the actual estimated distortion compensating coefficient. In FIG. 6, an interpolated value arithmetic section 530 is provided for the arithmetic.

It is now considered that the distortion compensating coefficient, which is estimated based on the algorithm, which has been already explained from the table 500 for storing the distortion compensating coefficient, is $h_n$, when it is $p_n$, and the coefficient is $h_{n+1}$, when it is $p_{n+1}$. Then, the relationship between $p_n$ and $p_{n-1}$ approximately interpolates with the value of one-order function h(p).

Then, the interpolated value can be obtained according to the equation (12) in the interpolated value arithmetic section 530.

$$h(p) = \begin{pmatrix} \frac{h_{n+1} - h_n}{p_{n+1} - p_n}(p - p_n) + h_n(p_n < p < p_{n+1}) \\ h_n \quad (p - p_n) \end{pmatrix} \quad (12)$$

If it is $h_n$ when p=$p_n$, p is in the range between $p_n$ and $p_{n+1}$ ($p_n$<p<$p_{n+1}$) the interpolated value can be obtained in the equation (12).

The obtained interpolated value is switched in a switch 531 and connected to the multiplier 60 in the structure shown in FIG. 6. With this structure, capacity of the table 500 for storing the distortion compensating coefficients can be reduced. Further, when the capacity of the table 500 becomes constant, it is possible to give the more detailed compensating coefficient value to the input signal X(t) and perform more detailed distortion compensation.

Figure 8:
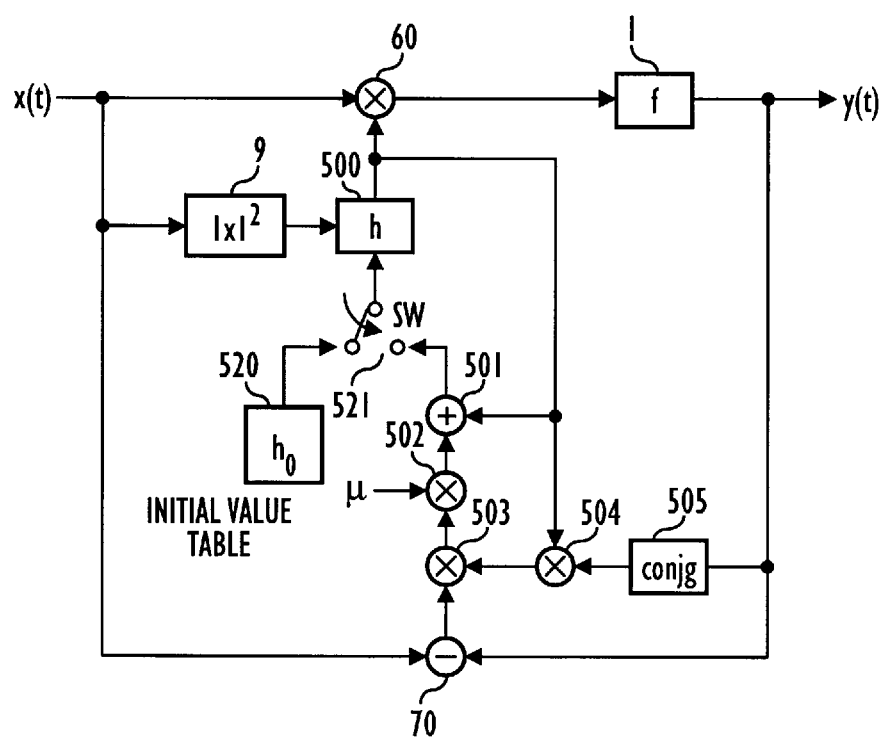
FIG. 8 shows a block diagram of a fifth embodiment of an amplifier having distortion compensation according to the present invention.

FIG. 8 shows a structural block diagram of a fifth embodiment according to the present invention. An initial value of the distortion compensating coefficients is prepared in advance to update with the use of the adaptive algorithm according to the condition. The structure shown in FIG. 8 comprises an initial value table 520 for holding the initial value of the distortion compensating coefficient, as employing the embodiment shown in FIG. 3 as a basis.

A switch 521 connects the initial value table 520 to multiply the prepared value as the distortion compensating coefficients to the input signal. According to the condition, the switch 521 is connected to the multiplier 501 to update with the estimated compensating coefficient value. With the structure, it can be realized to improve the speed of convergence.

Further, a structure shown in FIG. 8 is applied to the example with the use of LMS algorithm. However, it is not restrictive, and it is possible to apply similarly in the case where the RLS algorithm explained in FIG. 5 is employed.

Figure 9:
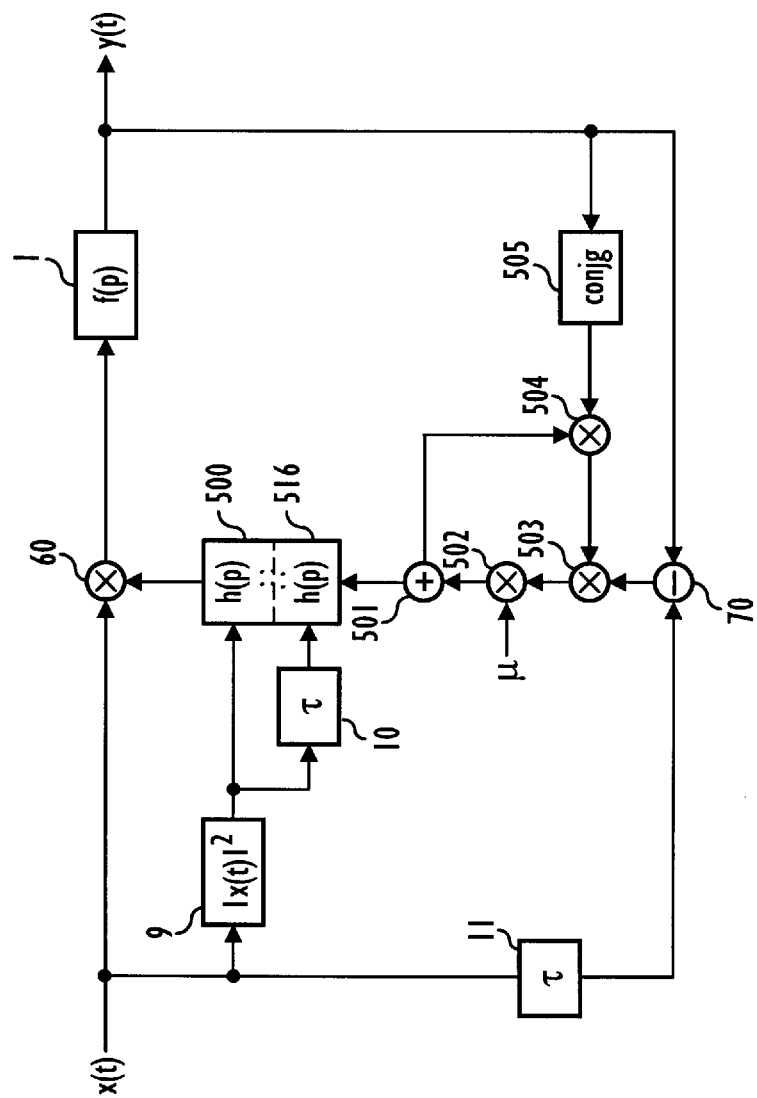
FIG. 9 shows a block diagram of a sixth embodiment of an amplifier having distortion compensation according to the present invention.

FIG. 9 is a block diagram of an embodiment, in which updating the contents of the table 500 for storing the distortion compensating coefficients and the multiplication of the distortion compensating coefficients for the input signal are performed independently. A structure shown in FIG. 9 uses the LMS algorithm shown in FIG. 3. However, it is not restrictive and it is of course possible to use the RLS algorithm shown in FIG. 5 for the structure shown in FIG. 9.

In FIG. 9, an added distortion compensating table 516 is provided, which is the same as the table 500 for storing the distortion compensating coefficient. Accordingly, the multiplication of the input signal with the distortion compensating coefficient value is performed according to the output of the table 500 for storing the distortion compensating coefficients. The distortion compensating coefficient values are updated in the added distortion compensating table 516.

Therefore, it becomes possible to independently perform the updating of the distortion compensating coefficient value and the multiplication of the distortion compensation coefficient for the input signal.

It is also possible to form the circuit by employing a dual port RAM, other than providing a pair of memories of tables as a table 500 for storing the distortion compensating coefficient value and the additional distortion compensating table 516. In FIG. 9, delay circuits 10 and 11 synchronize a timing of updating the distortion compensating coefficient values and multiplying the distortion compensating coefficients for the input signal to a predetermined interval.

Figure 10A:
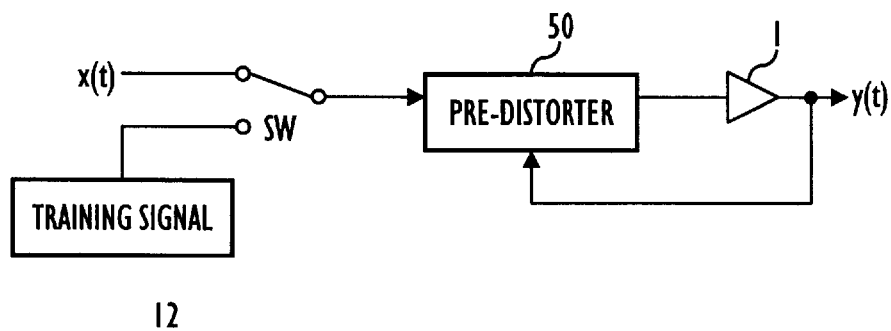
FIGS. 10A and 10B show block diagrams of a seventh embodiment of an amplifier having distortion compensation according to the present invention.

FIG. 10A shows an applied example of the distortion compensating amplifier according to the present invention. When considering the input of the modulator, it is required to give the distortion compensating coefficient h(t) corresponding to an optional input amplitude value on updating the distortion compensating coefficient. Therefore, it becomes important that the distortion compensating coefficient h(t) should be obtained in advance.

Figure 10B:
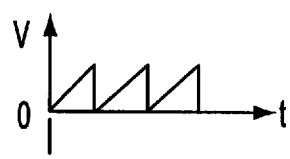

A training signal shown in FIG. 10B is a repeated sawtooth wave, which ascends from 0 to a constant amplitude. It is possible to obtain the distortion compensating coefficient h(t) in the range between 0 to the constant amplitude in advance by the use of this training signal. Therefore, it becomes possible to quicken the convergence to the adaptive distortion compensating coefficient.

Figure 11:
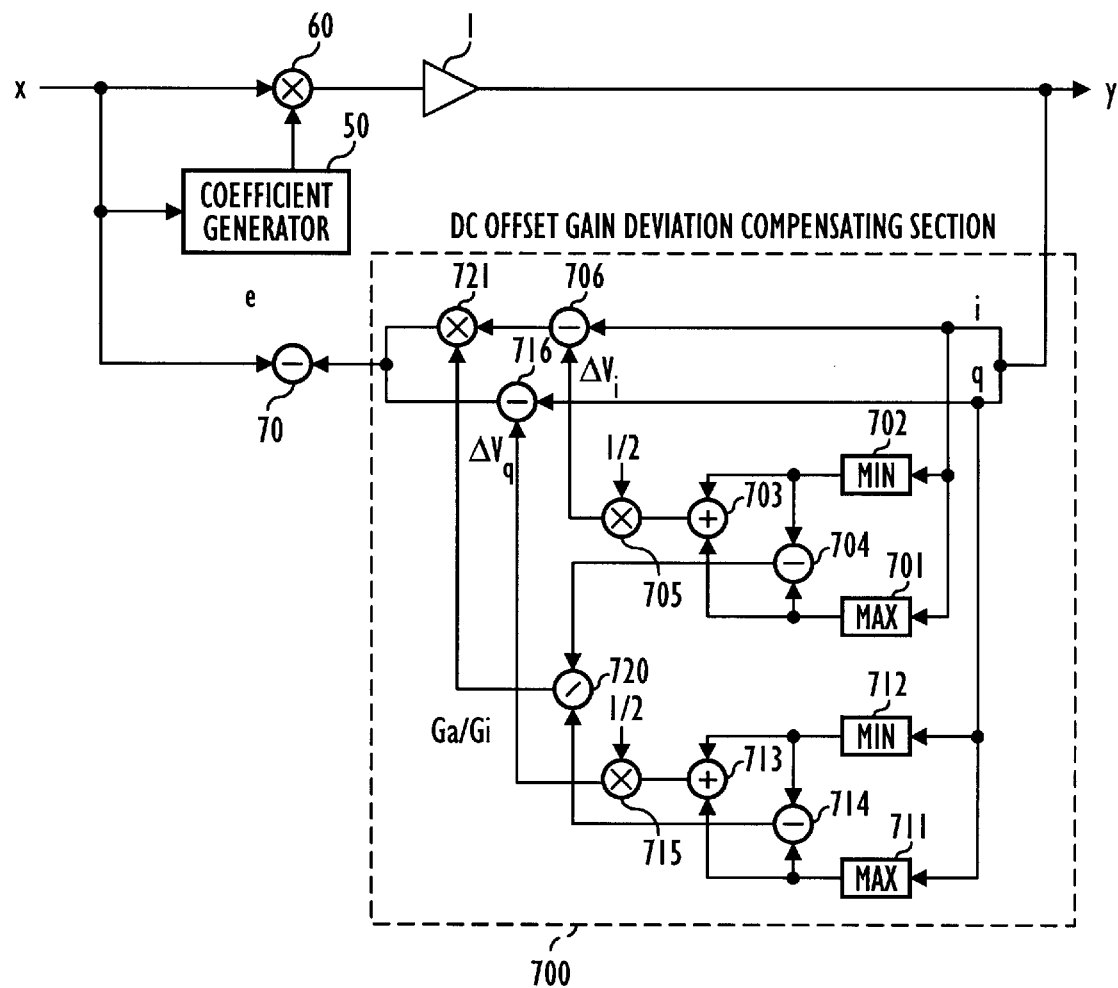
FIG. 11 shows a block diagram of an eighth embodiment of an amplifier having distortion compensation according to the present invention.

FIG. 11 shows a block diagram of an eighth embodiment of the present invention. As explained above, the predistorter according to the present invention uses the distortion compensating coefficient corresponding to the input amplitude. When the orthogonal demodulator 3 for obtaining the amplifier output signal has a gain deviation of DC offset and Ich and Qch channels, the correct compensating coefficient cannot be estimated. That causes deterioration of linearizing characteristic.

Accordingly, in the embodiment shown in FIG. 11, an automatic control for offset and gain of the decoder is performed in order to prevent from deterioration of characteristic. More particularly, automatic compensation is performed before estimation of $h_n(p)$, the demodulated phase is unknown. Then, offset and gain deviation is measured without depending on a demodulated phase.

Figure 12:
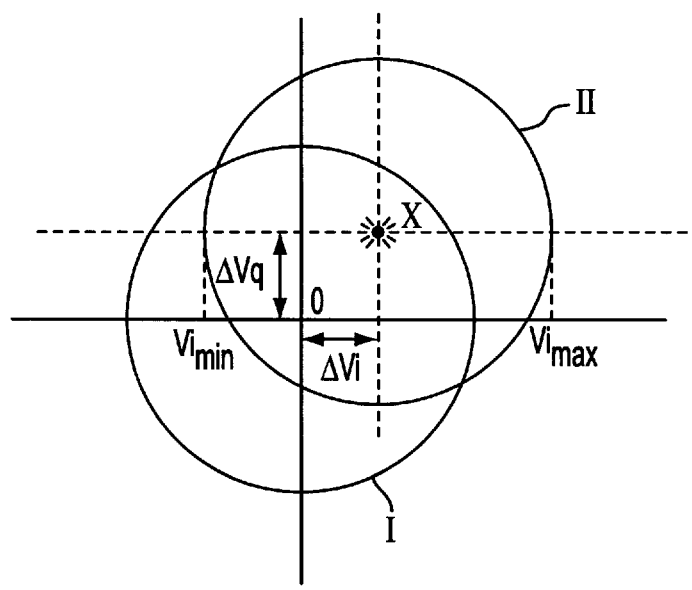
FIG. 12 is an explanatory diagram of the operation of the eighth embodiment shown in FIG. 11.

FIG. 12 is an explanatory diagram when there is a DC offset in the orthogonal demodulator 3. In FIG. 12, I means a unit circle on a complex plain in a normal case, and II means a unit circle on a complex plain in the case where there is a DC offset.

In FIG. 12, a unit circle, which is expressed with the equation (13), is outputted. The maximum values of Ich and Qch in this case are measured. When the maximum and minimum values of Ich and Qch are $v_{imax}$, $v_{imin}$, $v_{qmax}$, $v_{qmin}$, offsets $\Delta v_i$, $\Delta v_q$, and gains $G_i$, $G_q$ can be expressed as the equations (14) and (15), respectively.

$$V = e^{i\theta}, \quad 0 \leq \theta \leq 2\pi \tag{13}$$

$$\begin{pmatrix} \Delta V_i = \dfrac{V_{imax} + V_{imin}}{2} \\ \\ \Delta V_q = \dfrac{V_{qmax} + V_{qmin}}{2} \end{pmatrix} \tag{14}$$

$$\begin{pmatrix} G_i = \dfrac{V_{imax} - V_{imin}}{2} \\ \\ G_q = \dfrac{V_{qmax} - V_{qmin}}{2} \end{pmatrix} \tag{15}$$

where $\Delta v_i$ and $\Delta v_q$ are expressed as an arithmetic mean of $v_{imax}$, and $v_{imin}$, and an arithmetic mean of $v_{qmax}$ and $v_{qmin}$, respectively. Further, gain deviation can be obtained with the ratio $a_n = G_q/G_i$ of the gain $G_i$ of I channel : the gain $G_q$ of Q channel. When a=1, there is no gain deviation, and the unit circle becomes a clear circle.

The gain $G_i$ of Ich channel and the gain $G_q$ of Qch channel can be obtained as a half of the difference between the maximum and minimum values, as shown in the equation 6, respectively. The compensation of the gain deviation is performed, for example, by varying the Ich gain as employing Qch channel as a reference value.

The structure shown in FIG. 11 will be further explained. A compensating section 700 for compensating DC offset and the gain deviation is provided as a circuit for the above-described arithmetic, for the principle diagram shown in FIG. 2. Further, the orthogonal modulator 2 and the orthogonal demodulator 3 shown in FIG. 2 are not shown in the diagrams, similarly to the other embodiments, and only a structure of the base band signal is shown in the diagrams. The Ich and Qch signals, which are branched from the amplifier 1, are respectively inputted to Ich and Qch maximum value detector 701 and 711 and Ich and Qch minimum value detector 702 and 712. Further, the outputs of the Ich maximum value detector 701 and Ich minimum value detector 702 are inputted to adding and subtracting circuits 703 and 704. On the other hand, the outputs of the Qch maximum value detector 711 and the Qch minimum value detector 712 are inputted to adding and subtracting circuits 713 and 714.

The outputs of the adding circuits 703 and 713 are inputted to ½multipliers 705 and 715. Accordingly, the outputs of the subtracting circuits 705 and 715 become offsets $\Delta v_i$ and $\Delta v_q$ in the equation (14).

These offsets $\Delta v_i$ and $\Delta v_q$ are respectively inputted to the subtracting circuits 706 and 716 to subtract from Ich and Qch signals. Accordingly, the outputs of the subtracting circuits 706 and 716 become Ich and Qch signals, in which the offsets $\Delta v_i$ and $\Delta v_q$ are removed from the output of the amplifier 1.

Meanwhile, the outputs of the subtracting circuits 704 and 714 are inputted to a dividing circuit 720 to obtain the ratio, i.e., $G_q/G_i$. The multiplier 721 multiplies the ratio of $G_q/G_i$ with the output of the Ich subtracting circuit 706 to adjust the gain deviation with varying the Ich gain as employing a Qch signal as a reference value.

As described above, the output y(t) of the amplifier 1, of which offset and gain are adjusted, becomes an object of the comparison with the input signal x(t) in an error detector 7.

The corrected signal in the above-described manner can be given with the equation (16).

$$\begin{pmatrix} V_i = a_n(V_i - \Delta V_i), & a_n = G_q/G_i \\ \\ V_q = V_q - \Delta V_q \end{pmatrix} \tag{16}$$

The above-described gain deviation $a_n$ can be obtained with the actual division of gain as shown in FIG. 11. The dividing circuit 720 is employed to obtain the ratio $G_q/G_i$ of the gain. However, it is general to become a complex structure, in the case where division is executed with a digital circuit.

Figure 13:
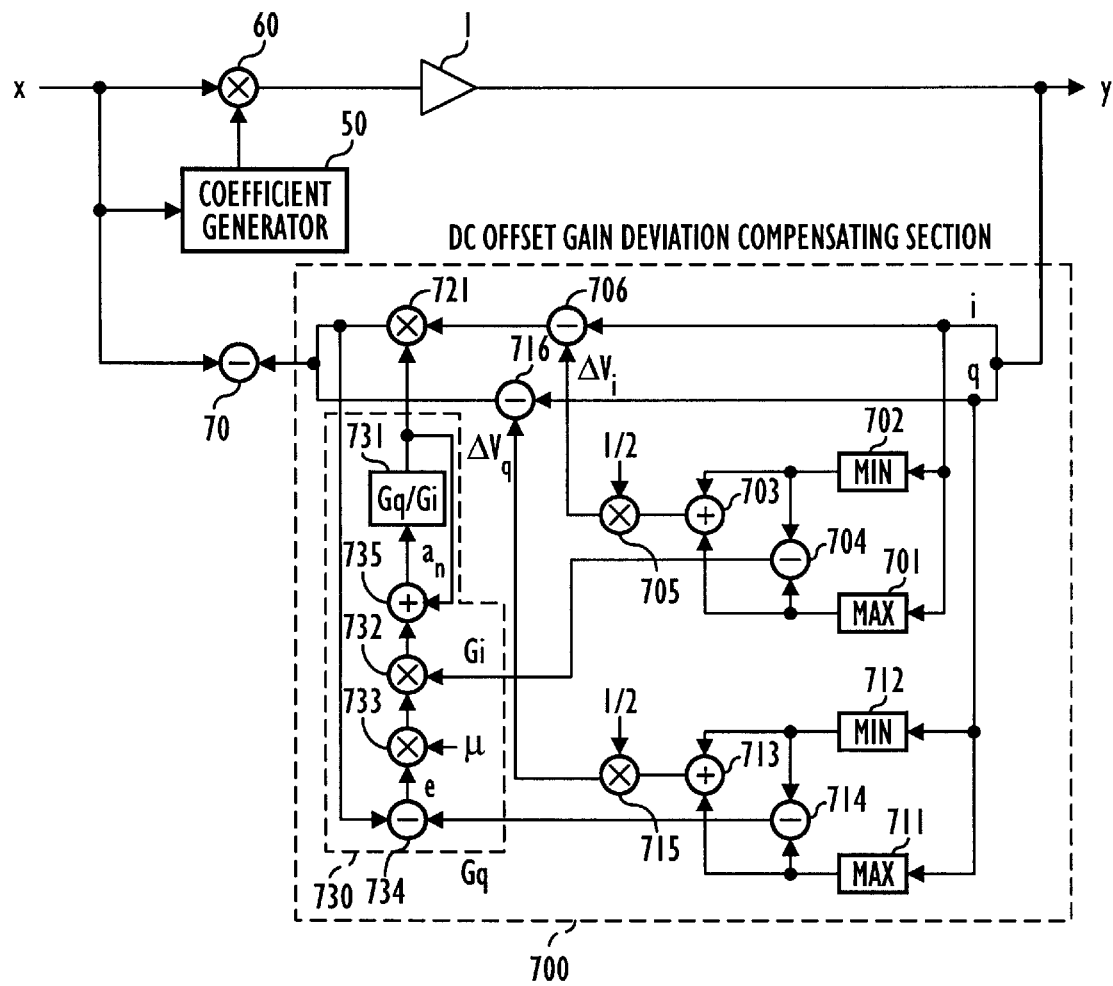
FIG. 13 shows a block diagram of a ninth embodiment of an amplifier having distortion compensation according to the present invention.

Consequently, FIG. 13 shows an embodiment, in which the estimated value $a_n$ of $G_q/G_i$ is estimated with the LMS algorithm so as that the difference between $G_q$ and $G_i$ be 0, with the use of the real division in the dividing circuit 720 shown in FIG. 11. The estimated value $a_n$ can be obtained according to the equations (17) and (18) by the estimated circuit 730 shown in FIG. 13.

$$a_n = a_{n-1} + \mu e\, G_i \tag{17}$$

$$e = G_q - G_i a_{n+1} \quad (18)$$

The estimated value $a_n$ of $G_q$ and $G_i$, which is an input to the $G_q/G_i$ set memory circuit 731 having a memory function, is an output of the error circuit 734. Then, the multipliers 732 and 733 multiply a step parameter $\mu$ and an output $G_i$ of the subtracting circuit 704 with e, which is expressed in the equation (17). The result of the multiplication of $\mu e\ G_i$ and the output $a_n$ of the $G_q/G_i$ set circuit 731 is added in the adding circuit 735.

The estimated circuit 730 operates so as that the output e of the error circuit 734 to be 0. Actually, the estimated value $a_n$, which is multiplied in the multiplier 721, can be the same value as the ratio $G_q$ and $G_i$, according to the relationship of the equation (18).

In the embodiments shown in FIGS. 11 and 13, the case where the amplitude of the input signal is constant was explained. In this case, as the compensated value is obtained from only the maximum and minimum values of the Ich and Qch modulated signal, the case can be applied to the random input signal by taking the measurement time longer. Additionally, it can be realized to have more accuracy of compensation by using the average value of the above-described measurements as a compensated value.

Figure 14:
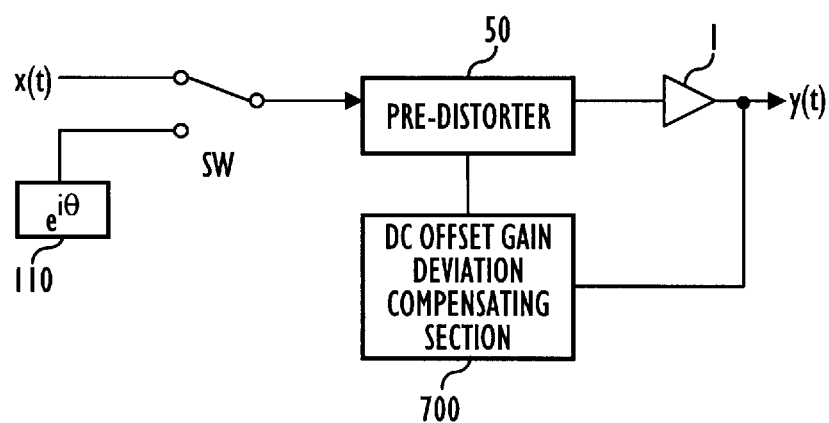
FIG. 14 shows a block diagram of a tenth embodiment of an amplifier having distortion compensation according to the present invention.

However, there is a problem to take much time. FIG. 14 shows a tenth embodiment of the present invention to cope with the above-described problem. In the structure of the tenth embodiment, a unit circle generator 110 for outputting a unit circuit as a training signal is provided. If the output of the unit circle generator 110 is inputted to the training period instead of x(t), the compensated coefficients can be obtained by outputting the signal running around the unit circuit.

It becomes possible to form by storing the values of sine and cosine in the ROM table in correspondence with the real and imaginary parts to access subsequently.

As explained according to the above-described embodiment, the amplifier for performing distortion compensation according to the present invention brings effectiveness as follows;

(a) The capacity of the distortion compensating table of the pre-distorter with the digital processing can be reduced less than $\frac{1}{2}^n$ (n means quantized bit numbers of input signals). Therefore, on the use of the signal having larger dynamic range, it can be realized that the capacity of the memory can be largely reduced, although there are some problems for having a suitable scale of the circuit in the prior art.

Further, when there is a restrict limitation of space or consumptive power on portable terminals and the like, it becomes possible to use a linearizer, which can improve with the capacity of the internal RAM, such as a single chip LSI or DSP.

(b) There is no need to use a phase shifter for controlling demodulated phases and perform phase-rotation arithmetic, so that it is not required to compensate according to the temperature variation and changing in time. Therefore, the stable distortion compensating characteristic can be obtained regularly.

(c) As there is the wide allowable range for incompleteness of demodulating group, it can be possible to reduce the cost of hardware and reduce the steps for adjustment.

(d) It can be possible to perform ideal pre-distortion with no influence of delaying the amplifier and the filter and so on.

Figure 15:
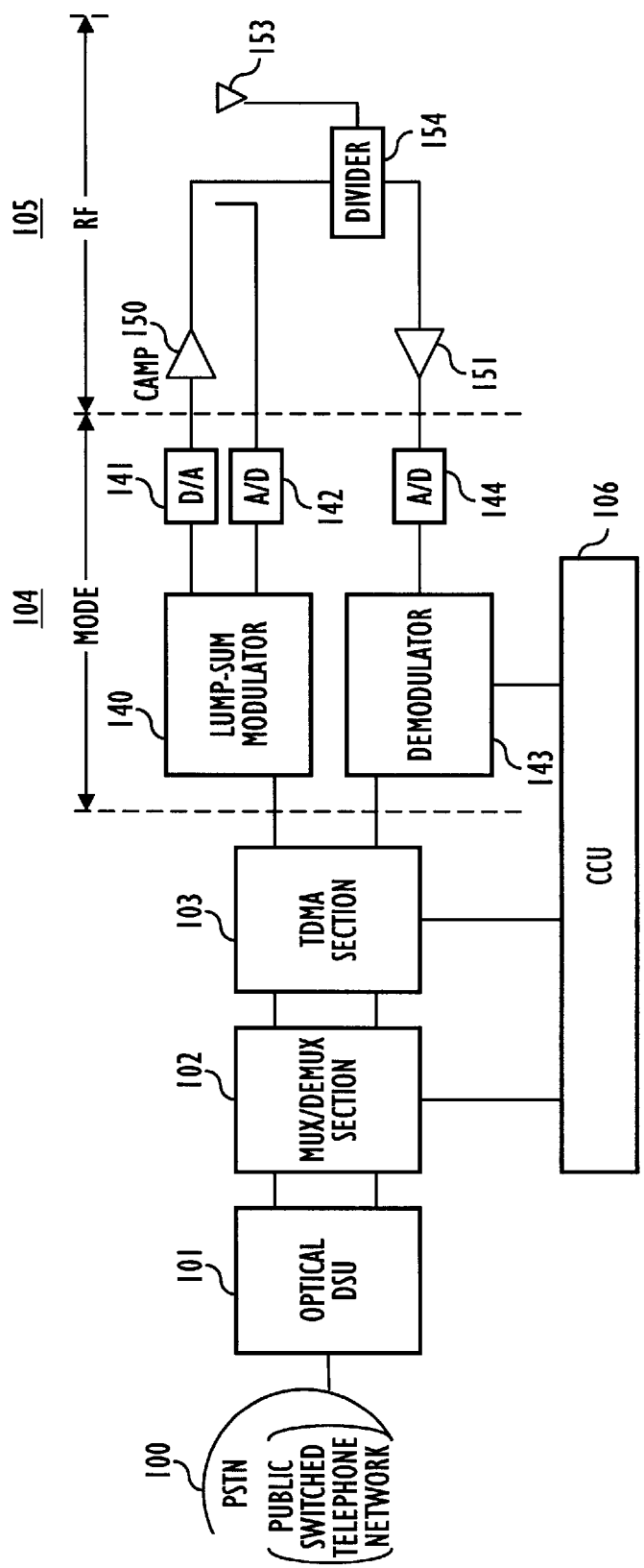
FIG. 15 is a diagram for explaining a position, at which a base station is provided for radio communication employing an amplifier having distortion compensation.

FIG. 15 shows a positioning of a base station for radio communication, which is an object of the present invention. In an example of the base station for radio communication, which is an object of the present invention, the base station is connected to a public communication network 100, and terminates an optical multiplexed signal sent from the public communication network 100 in a DSU (Digital Service Unit) 101, which is a data circuit terminating equipment.

The optical multiplexed signal, which is terminated in the DSU 101, is converted to an electrical signal, and the converted signal is inputted to a multiplexer/demultiplexer 102. The multiplexer/demultiplexer 102 multiplexes/demultiplexes the converted signal and sends it the multiplexed/demultiplexed signal is sent from an antenna 153 via a TDMA section 103, a modem 104 and a radio frequency section 105. The modem 104 comprises a lump-sum modulator 140 for lump-sum modulating downward signals flowing direction toward the antenna 153 for a plurality of channels, and a D/A convertor 141 for converting the output of the lump-sum modulator 140 to an analog signal.

A power amplifier 150 in a radio frequency section 105 amplifies and outputs the analog output of the D/A convertor 141 via the antenna 153. Then, the lump-sum modulator 140 has a linearizing function for erasing the distortion by giving a compensated value to the signal in advance for the distortion of the power amplifier 150.

The size of the compensated value with the use of this linearizing function is decided by feeding back a part of the output of the power amplifier 150, and referring the level of the feed-back signal. Further, as the linearizing function is processed digitally, the function has an A/D convertor 142 for converting an analog signal, which is a part of the output from the power amplifier 150, to a digital signal.

On the other hand, the upward radio frequency signal, which is received by the antenna 153, is inputted to a low-noize amplifier 151 by branching in a divider 152. The amplified signal in the amplifier 151 is converted to the digital signal in the A/D convertor 144 and the a plurality of channel signals are demodulated in the demodulator 143.

Then, the signals are subjected to the processing reversed to that for the above-described downward signal flowing toward the antenna 153, and are sent to the public communication network 100 via the TDMA section 103, the MUX/DMUX section 102 and the optical DSU section 101.

Figure 16:
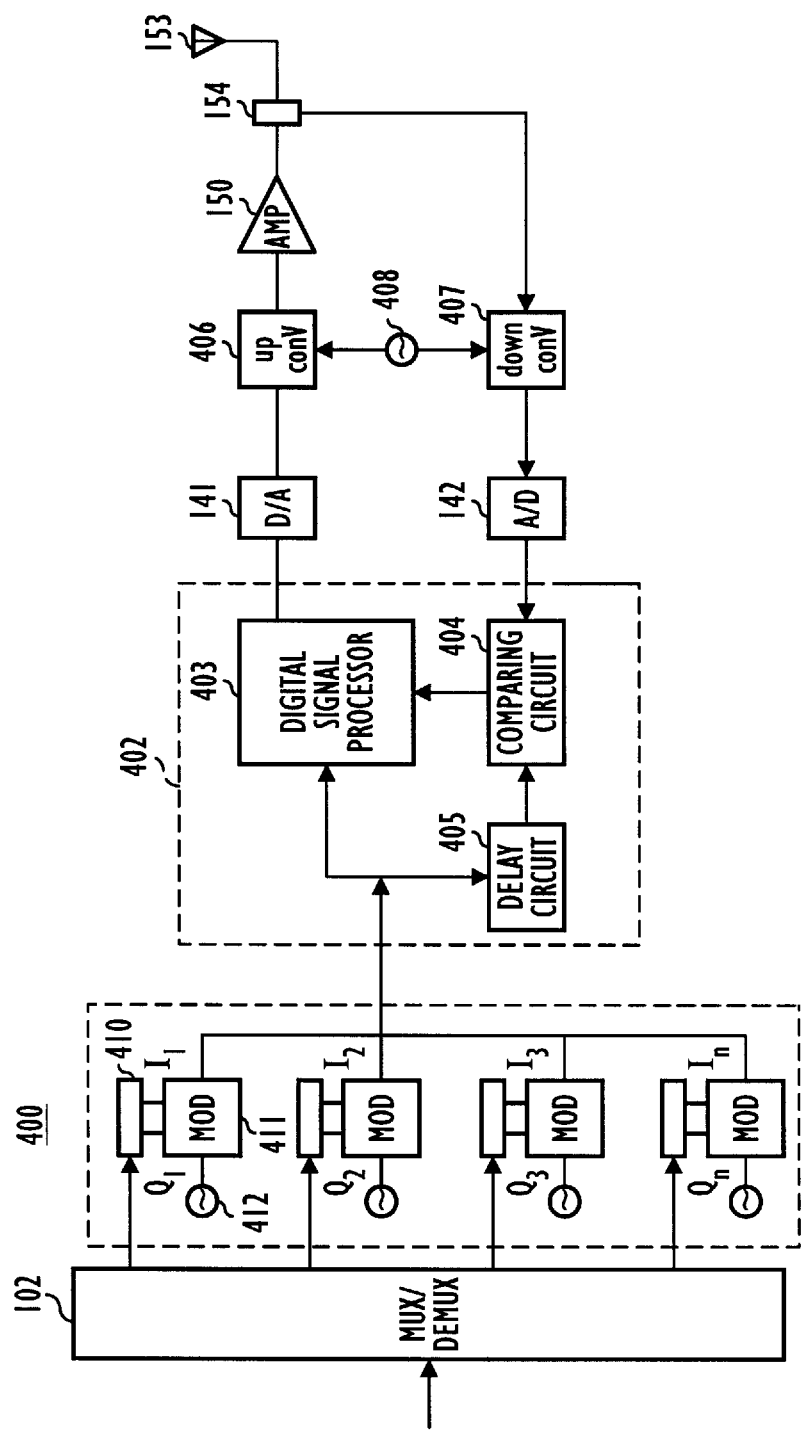
FIG. 16 is a diagram for explaining an outline of basic structure of a base station for radio communication.

In FIG. 15, a CCU 106 supplies a clock signal to the MUX/DMUX section 102, the TDMA section 103, a lump-sum modulator 104, and a lump-sum demodulator 143, and controls operation timings. Referring to FIG. 16, an explanatory diagram showing a structure of the base station for radio communication according to the present invention is shown. Shown is a detailed structural block diagram of mainly explaining a lump-sum modulator 140 of the modem section 104. Further, the structure of the TDMA section 103 will be abbreviated.

In FIG. 16, reference number 400 is a trans-multiplexer, which is a group modulator composing a lump-sum modulator 140. The trans-multiplexer 400 comprises a carrier signal oscillator 412, an Ich/Qch signal generator 410 and a modulator 411 for each of a plurality of carriers. As the trans-multiplexer 400 generates the plurality of carriers on the digital signal processing, for example, by the use of FETs, there is no use of an analog oscillator or modulator. Then, the output is a digital signal. However, FIG. 16 shows an analog group as an example to understand the structure easily.

The output of the trans-multiplexer 400 is inputted to a linearizing circuit 402, which is an part of a lump-sum modulator 140.

Further, FIG. 16 shows only a downward linearizing circuit 402 flowing toward the antenna 153. Further, FIG. 16 shows a up-convertor 406 for converting to a radio frequency and a down-convertor 407 for converting from the radio frequency.

The linearizing circuit 402 comprises a digital signal processor 403 and a comparing circuit 404. A delay circuit 405 controls processing time in the digital signal processor 403. The comparing circuit 404 compares amplitudes and phases of the outputs of the delay circuit 405 and the down-convertor 407 with those of the outputs converted to the digital signal by the A/D convertor 142.

The digital signal processor 403 gives the compensating distortion to the input signal so as to compensate the distortion of the power amplifier 150 in advance, based on the result of comparison of the comparing circuit 404. In the present invention, a structure employing the digital signal processor 403 is employed. Further, in the present invention, it can be improved to have the maximum of the operation speed of the A/D convertors 142 and the D/A convertor 141 to several 10 MHz.

Figure 17:
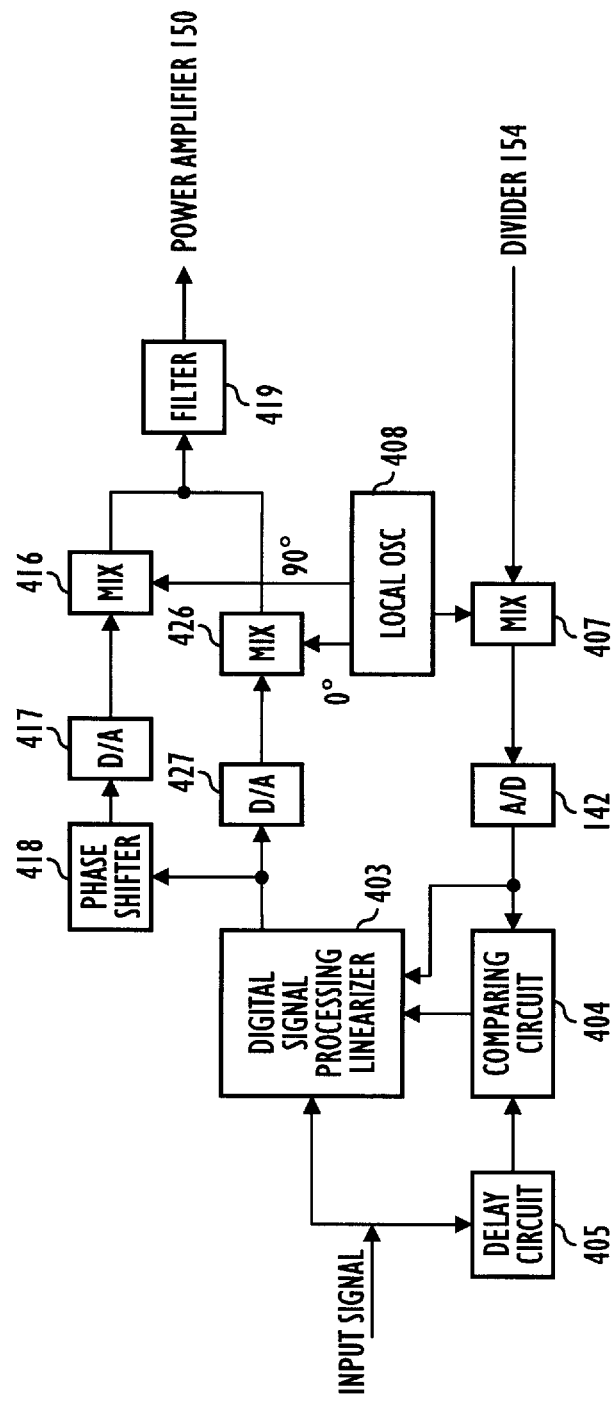
FIG. 17 is a block diagram of a first embodiment of a base station for radio communication according to the present invention.

FIG. 17 shows a block diagram of a first embodiment of a base station for radio communication according to the present invention. More particularly, FIG. 17 shows only a linearizing circuit 402, and an adding circuits, which are added for the linearizing circuit 402 according to the present invention. As described above, in the structure shown in FIG. 16, it is required to convert frequencies, because the output frequencies of the A/D convertors 142 and the D/A convertor 141 have the maximum of several 10 MHz. Consequently, the base station for radio communication according to the present invention uses image rejection type convertors as the above-described up-convertor 406 and the down convertor 407 easily to suppress useless side bands, increase a handling power by 3 dB, and then suppress generation of distortion.

However, when an image rejection type frequency convertor is employed, a 90 degree phase shifter is required. In FIG. 17, the up-convertor 406 is formed of up-convertors 416 and 426. The output of the digital signal processor 403 is further inputted to the up-convertor 416 via the 90 degree phase shifter 418 and the D/A convertor 417. On the other hand, the output of the digital signal processor 403 is further inputted to the up-convertor 426 via the D/A convertor 427.

If specific base band is large, it is difficult to form the 90 degree phase shifter 418 with a passive circuit. It is easy to form the shifter with a digital circuit. Accordingly, in the present invention, the 90 degree phase shifter 418 is formed of a digital processor to obtain analog signals, which are obtained from the Ich/Qch signal, respectively, by the D/A convertors 417 and 427, and input the signals to the image rejection type up-convertors 416 and 426.

In FIG. 17, the outputs of the image rejection type up-convertors 416 and 426 are inputted to the power amplifier 150 after useless waves are removed by the filter 419 in common.

Further, an oscillator 408 oscillates local signals having a 90 degree phase difference therebetween, which are carrier wave signals inputted to the up-convertor 416 and 426 and the down-convertor 407.

The digital signal processor constituting the linearizing circuit 402, which is hereinafter called as a linearizer when appropriate can be realized with a circuit for forming an amplifier having distortion compensation, as described above with referenced to FIGS. 2 to 14. The linearizer 402 will be again explained by referring to FIG. 3 as follows.

FIG. 3 shows a structure of a linearizer formed with the use of a Least Mean Squares (LMS) algorithm. In FIG. 3, distortion function of the frequency power amplifier 150 shown in FIGS. 15 to 17 corresponding to reference numeral 1 shown in FIG. 3 is employed as f(p). A memory 500 stores distortion compensating coefficients h(p) estimated for the distortion function f(p) of the power amplifier 150.

Further, reference numerals 60, and 502 to 504 are multipliers, and 501 is an adder. A reference numeral 9 is a circuit, which obtains the absolute value of an input base band signal x(t), and 505 is a circuit for obtaining conjugate values for the output of the A/D convertor 142. The comparing circuit 70 is a subtracter for outputting the difference between the both of the input base band signal X(t) and the output of the power amplifier 150 or the circuit 1 of FIG. 3.

With the structure shown in FIG. 3, a linearizer realizes the above-described equations (1) to (6). Further, in these equations, x(t) means an input base band signal, f(p) means a distortion function of the power amplifier, h(p) is the estimated distortion compensating coefficients, and $\mu$ means a step size parameter. Further, x, y, f, h, u and e are complex numbers, and * expresses a conjugate complex number.

u(t) is used as $h_{n-1}(p)h_{n-1}(p) \approx 1$, which shows that the distortion of amplitude of the high-frequency power amplifier 150 is not large.

The digital signal processor, which forms a linearizing circuit 402, is not restricted to the structure shown in FIG. 3. It should of course be understood that all of the embodiments of the above-described amplifier having the distortion compensation in FIGS. 2 to 14 are within the applicable scope for the base station for radio communication according to the present invention.

Figure 18A:
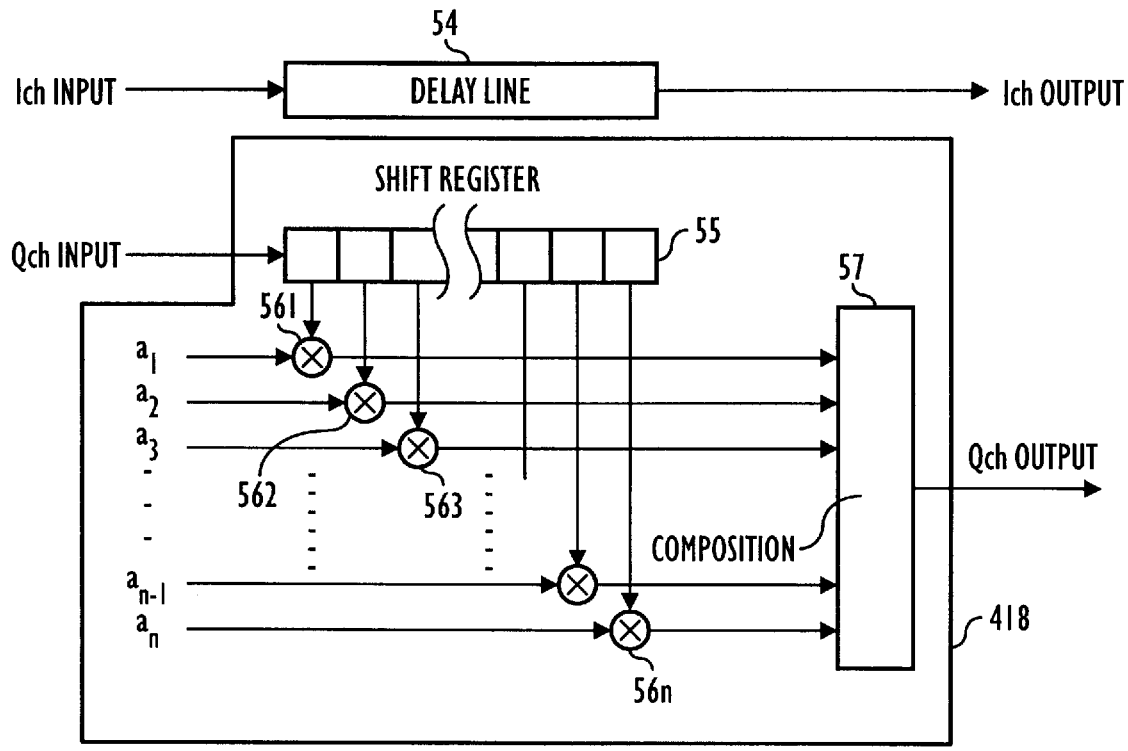
FIGS. 18A and 18B show a structural block diagram of a 90 degree phase shifter by the use of digital signal processing.
Figure 18B:
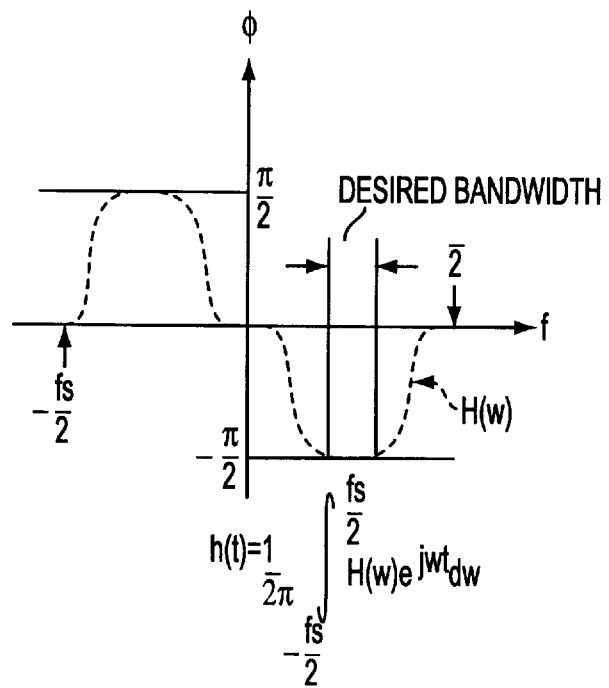

FIG. 18A shows a block diagram of a structural example of a 90 degree phase shifter 418 shown in FIG. 17, and FIG. 18B shows an operational waveform of the shifter. In FIG. 18A, a Qch signal is inputted to the 90 degree phase shifter 418. On the other hand, a delay circuit 54 for controlling delay time in the 90 degree phase shifter 418 is inserted to the side of Ich signal to coincide the delay between the Ich and Qch signals.

The 90 degree phase shifter 418 is basically formed of a transversal filter. A delay circuit for transversal filter 55 is formed of a shift register. The output of the shift register 55 on each stage is inputted to the multipliers 561 to 56n, and the outputs respectively are multiplied with the weighted coefficients $a_1, a_2, \ldots, a_n$.

The weighted coefficients $a_1, a_2, \ldots, a_n$ are determined as shown in FIG. 18B. H(w) is a function, which shifts a phase from P/2 to −P/2 between $-f_s/2$ and $f_s/2$. In FIG. 18A, the weighted coefficients $a_1, a_2, \ldots, a_n$ are selected in the required band 58, so as to find the function h(t) shown in the following equation (19).

$$h(t) = \int_{-\frac{fs}{2}}^{-\frac{fs}{2}} H(w)e^{jwt}dw \tag{19}$$

Figure 19A:
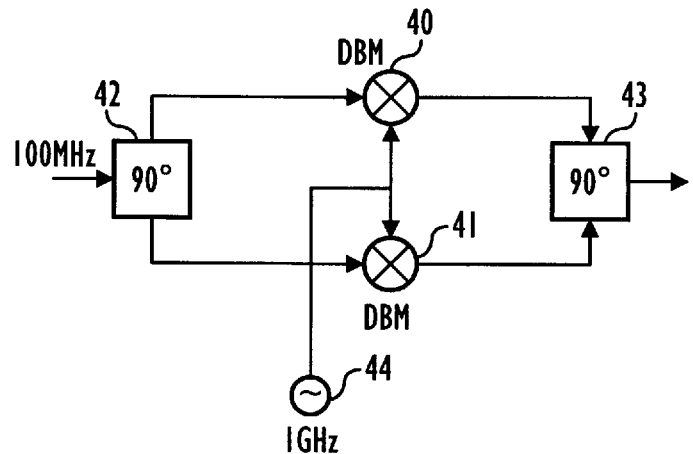
FIGS. 19A and 19B show a structure of an image-rejection type up-convertor.
Figure 19B:
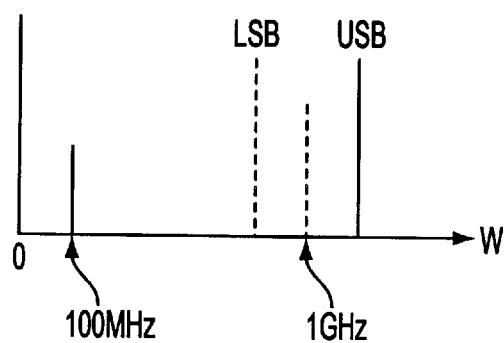

FIG. 19A shows a structural example of an image rejection type up-convertors 416 and 426, and FIG. 19B shows an explanatory diagram of the operation. A down-convertor 407 has the same structure of the up-convertor. However, only the input direction is reversed.

In FIG. 19A, the image rejection type up-convertors 416 and 426 comprise a pair of double balanced type modulators 40 and 41 and 90 degree phase shifters 42 and 43. For example, a signal of 100 MHz is inputted to a 90 degree phase shifter 42, which is a distributer. The 90 degree phase shifter 42 generates signals having a phase difference of 90 degree, and inputs the signals to the double balanced type convertors 40 and 41.

The double-balanced type modulators 40 and 41 respectively receive a carrier signal of 1 GHz from the carrier signal oscillator 44 and multiply the received carrier signal with the output of the 90 degree phase shifter 42, and the 90 degree phase shifter 43, which is a mixer, mixes and outputs them.

FIG. 19B shows a frequency spectrum on the above-described structure. A signal of 100 MHz is mixed with the signal of 1 GHz, and only a upper side band USB is outputted from the 90 degree phase shifter 43.

Figure 20A:
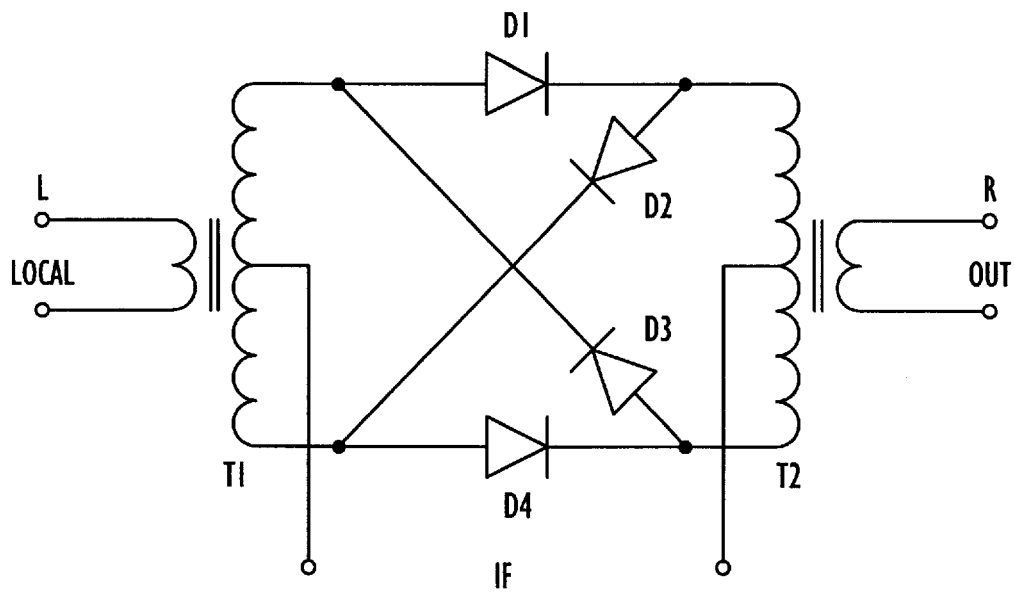
FIGS. 20A and 20B show a structural example of a double-balance type modulator.
Figure 20B:
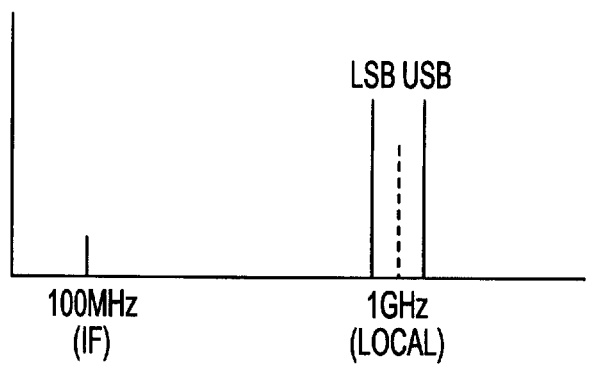

FIGS. 20A and 20B show structural examples of the double balanced type modulators 40 and 41 having diodes D1 to D4 and transformers $T_1$ and $T_2$, each of which has an intermediate taps. A carrier sent from the carrier signal oscillator 44 is inputted to the primary side of the transformer T1. Further, in the example of FIG. 19A, an IF signal, i.e., a signal of 100 MHz is inputted between the intermediate taps of the transformers 40 and 41.

As shown in FIG. 20B, the upper and lower side bands USB and LSB are outputted from the output OUT of the transformer 41. As explained in FIG. 19A, the outputs of the transformers 40 and 41 are inputted and mixed to the 90 degree phase shifter 43, each of which has the phase difference of 90 degrees. Therefore, the lower side band LSB shown in FIG. 20B is erased, and only a upper side band is outputted.

Figure 21:
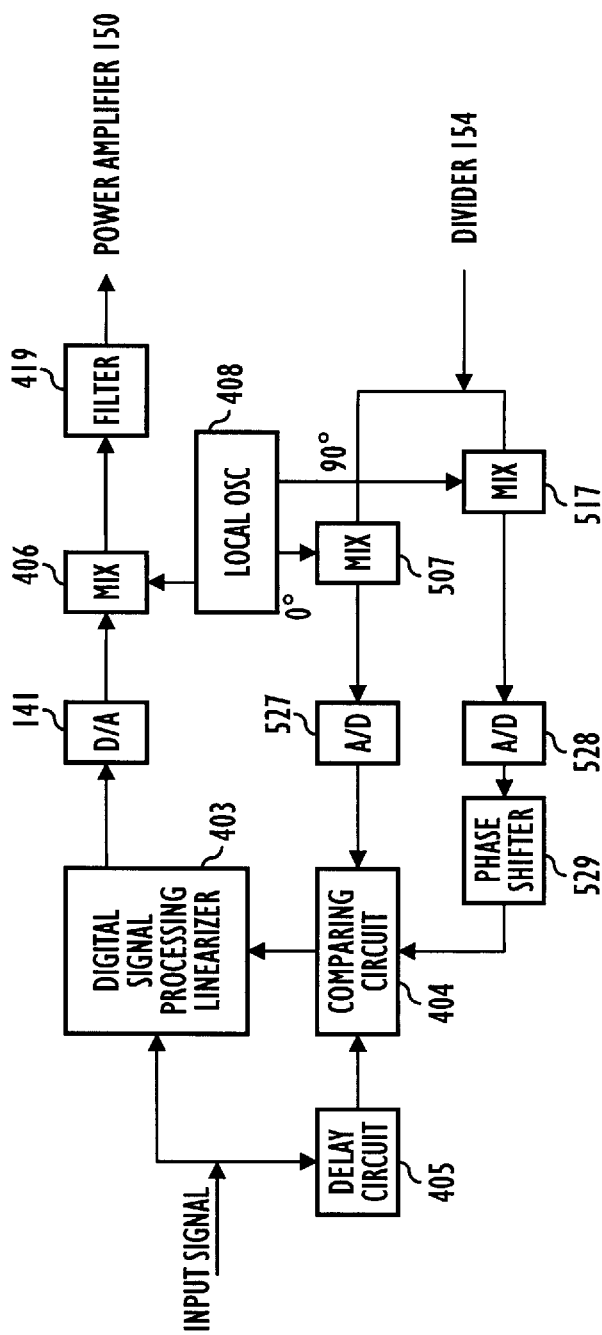
FIG. 21 shows a block diagram of a second embodiment of a base station for radio communication according to the present invention.

FIG. 21 shows a second embodiment of a base station for radio communication according to the present invention. The embodiment is structured with employing image rejection type convertors 507 and 517 as the down-convertor 407 (refer to FIG. 16) according to the same principle of FIG. 17 for processing downward signals sent from the antenna 53 to a divider 52.

Consequently, a 90 degree phase shifter 529 receiving the output of the A/D convertor 528 is formed as a digital processing circuit as shown in FIG. 18A.

Figure 22:
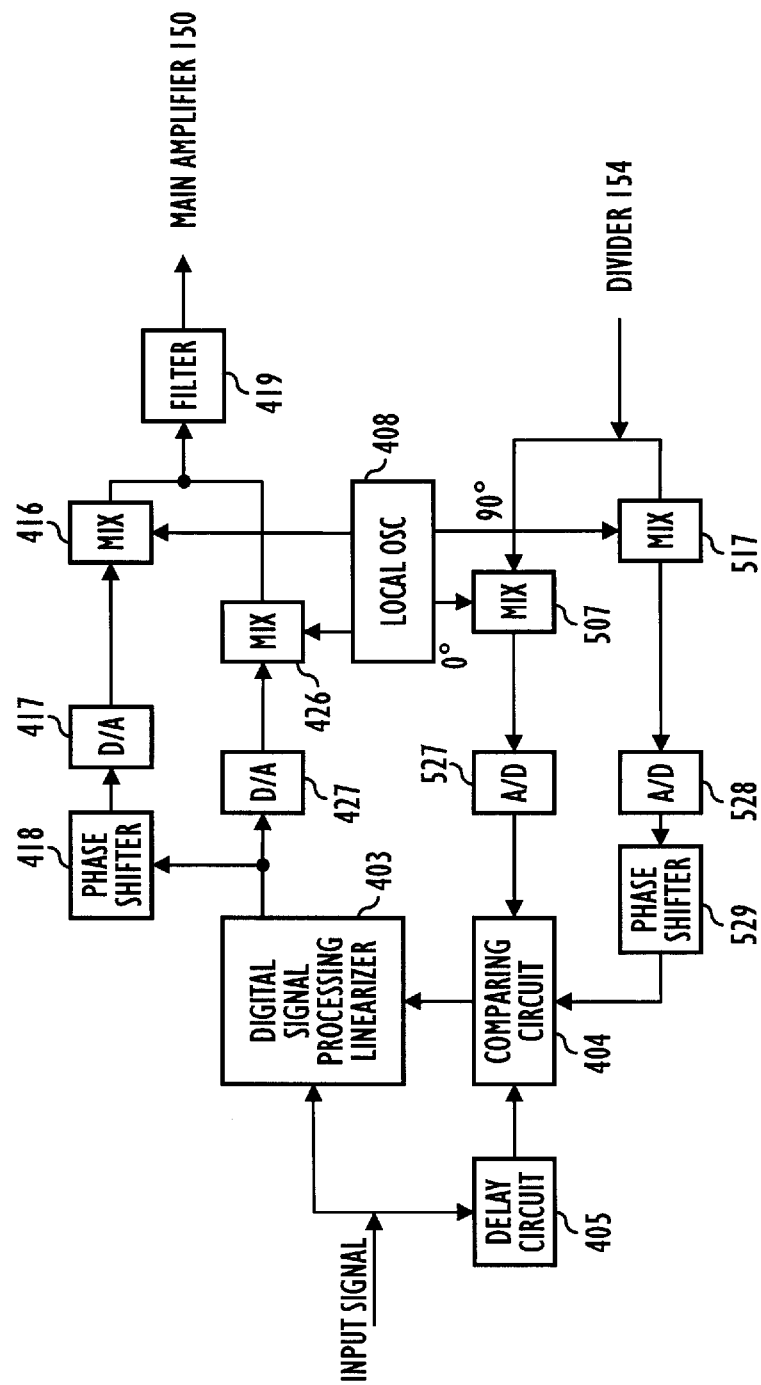
FIG. 22 shows a block diagram of a third embodiment of a base station for radio communication according to the present invention.

FIG. 22 shows a third embodiment of a base station for radio communication. The structure is formed by combining the structures shown FIGS. 17 and 21 and providing image rejection type convertors 416, 426, 507 and 517 for upward and downward signals, and a 90 degree phase shifters 418 and 529 with the use of a digital processor.

With the structure as shown in FIG. 22 for upward and downward signals, it is possible to generate the distortion compensating components of the main amplifier 150, which is a power amplifier, having high accuracy in the digital signal processor 403.

In the above-described digital linearizing method with the use of a digital signal processor 403, D/U (a ratio of signal band distortion) of output signals of the D/A convertor depends on bit accuracy, i.e. bit number, of the D/A convertor. Further, in the case where the input signal is an analog signal, A/D conversion is required to digitize the signal. However, noise of the A/D conversion is mixed, and that brings deterioration of D/U.

In this case, it is possible to improve the distortion by combining with a feed-forward method. That means, the feed-forward method obtains the distortion components by branching a part of the input signal and obtaining the difference with a part of the output of the amplifier. The distortion component is erased by adding the distortion component with the output of the amplifier in the reversed direction.

Figure 23:
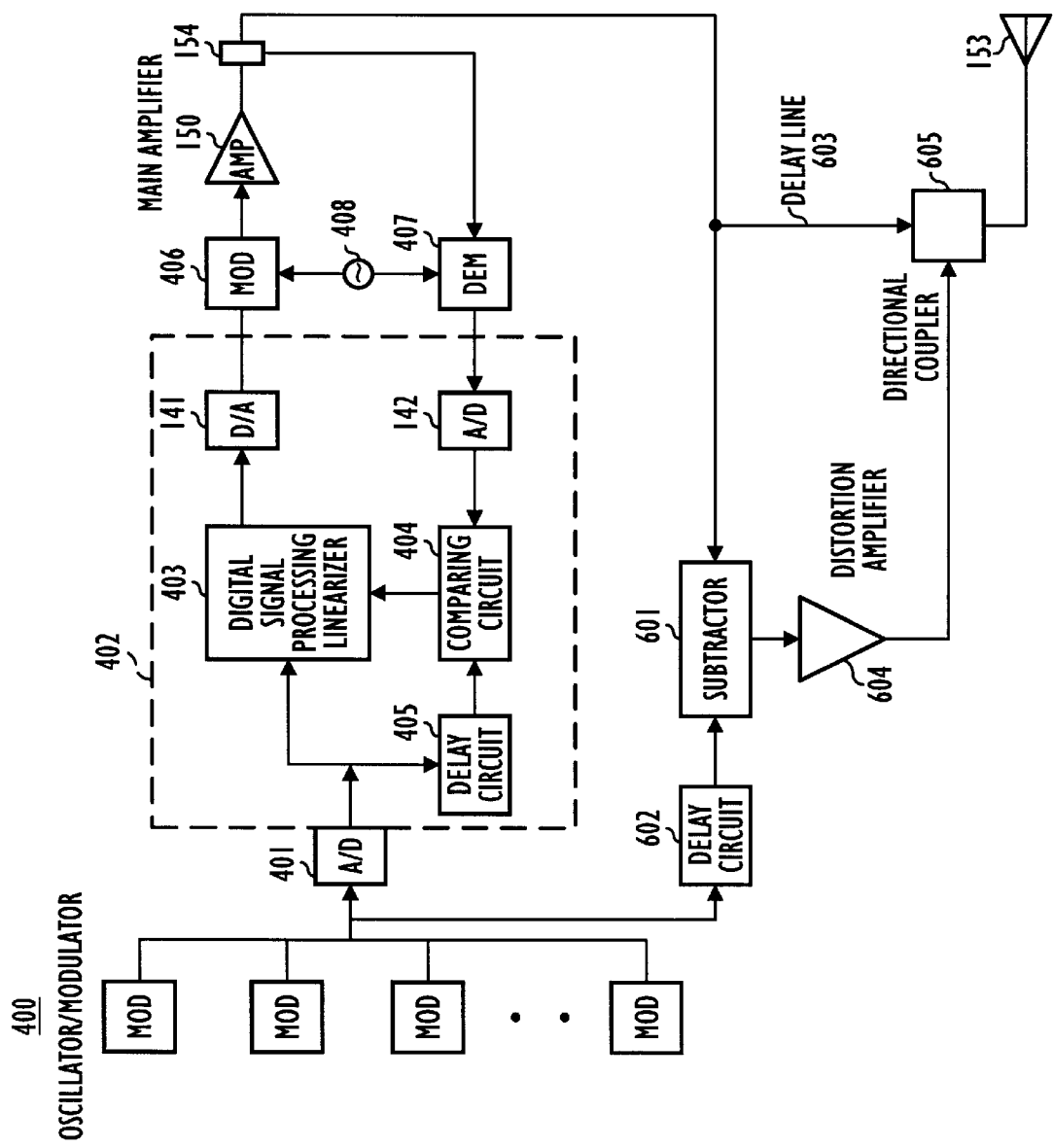
FIG. 23 shows a block diagram of a fourth embodiment of a base station for radio communication according to the present invention.

FIG. 23 shows a fourth embodiment of a base station for radio communication according to the present invention. In the embodiment, the above-described feed-forward method is employed.

The outputs sent from the modulator group 400 are branched, and a part of the branched outputs is inputted to the linearizing circuit 402 via the A/D convertor 401. The remainder of the branched outputs are inputted to a subtracter 601 via the delay circuit 602. The subtracter 601 obtains the difference between the branched input component and the output of the power amplifier 150 and a distortion amplifier 604 (an amplifier having low distortion, of which amplifying ratio makes lower) amplifies it. A directional coupler 605 removes the amplified distortion components from the output of the power amplifier 150.

In each of the above-described embodiments, the distortion can be steeply reduced by employing the digital linearizer 402. Simultaneously, it becomes possible to further suppress the distortion of 10 to 20 dB with the use of consumptive power of the amplifier having minute distortion.

Each of the above-described embodiments of the base station for radio communication uses a pre-distortion method. Therefore, there is no need to update data by feeding back, after the distortion compensating data is once made, if the parameters relating to linearity of device to be compensated.

Accordingly, in only a case of slow changing, such as temperature or change in time, the distortion compensating parameter may be updated. That means there is no problem to use intermittently feeding back. Therefore, it is possible to reduce the consumptive power of the distortion compensating section.

Figure 24:
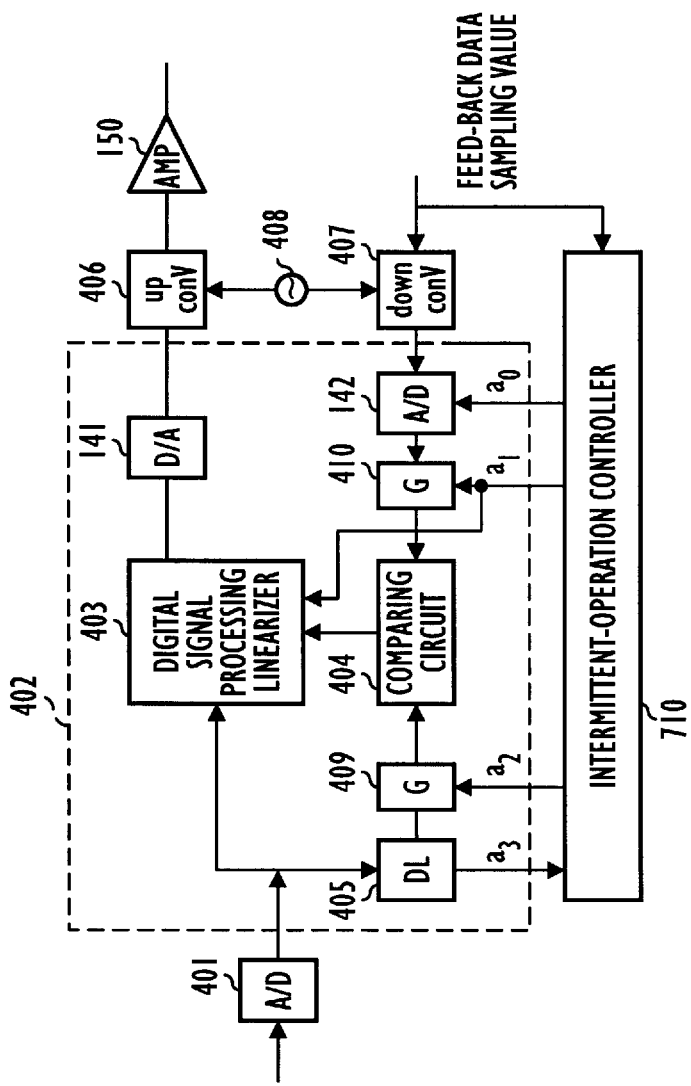
FIG. 24 shows a block diagram of a fifth embodiment of a base station for radio communication according to the present invention.

FIG. 24 shows a block diagram of a fifth embodiment of a base station for radio communication of the present invention, which performs feeding back intermittently. As compared with the structure shown in FIGS. 16 and 17, a gate 409 is provided between the delay circuit 405 and the comparing circuit 404, and a gate 410 is provided between the A/D convertor 142 and the comparing circuit 404, respectively.

Further, an intermittent-operation controller 710 controls the operation of the gate circuits 409 and 410 and the A/D convertor 142, intermittently, and operates the distortion compensation, intermittently.

Figure 25:
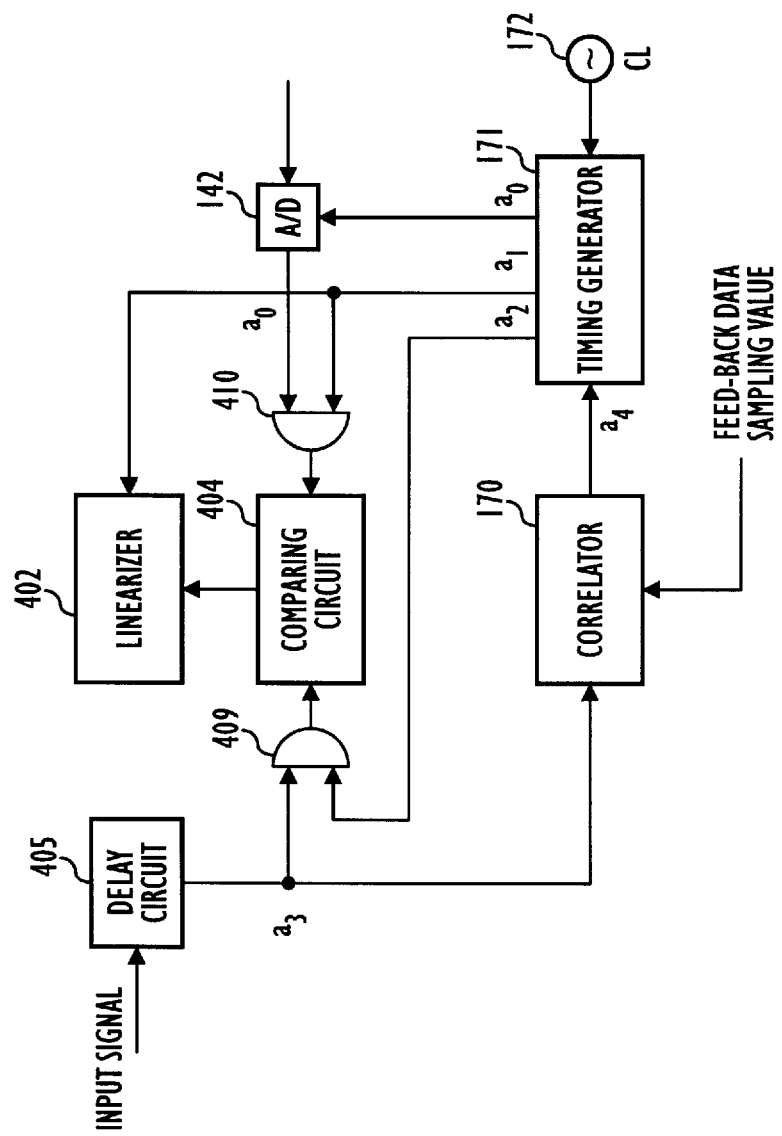
FIG. 25 is an explanatory diagram of a structural example of intermittent operation.

FIG. 25 is a diagram for explaining a structure for controlling the distortion compensating operation, intermittently. In FIG. 25, the intermittent-operation controller 710 is formed by a correlator 170, a timing generator 171 and a clock generator 172.

Clocks $a_0$, $a_1$, and $a_2$ are generated by employing a clock CL sent from the clock generator 172 as a reference. Further, when the input and output of the correlator 170 are $a_3$ and $a_4$, the relationship of each clock is as shown in FIGS. 27A to 27E.

When duty of an intermittent-operation of a feed-back group sent from the power amplifier 150 is $\frac{1}{10}$, for example, the operation stops for 9 seconds and the operation starts for one second, generation of clocks $a_0$, $a_1$, and $a_2$ sent from the timing generator 71 so as to be ON in the time $t_0$, be OFF in the time $t_{0+1}$, and be ON again in the time $t_{0+9}$.

The A/D convertor 142, AND gates 409 and 411 are operated in the times $t_0$ and $t_{0+9}$. Accordingly, even if the input signal has a phase shift, such as ①and ②( of $a_3$ shown in FIG. 27C, it is possible to keep the timing rightly to the input signal of $a_3$ ①.

Figure 26A:
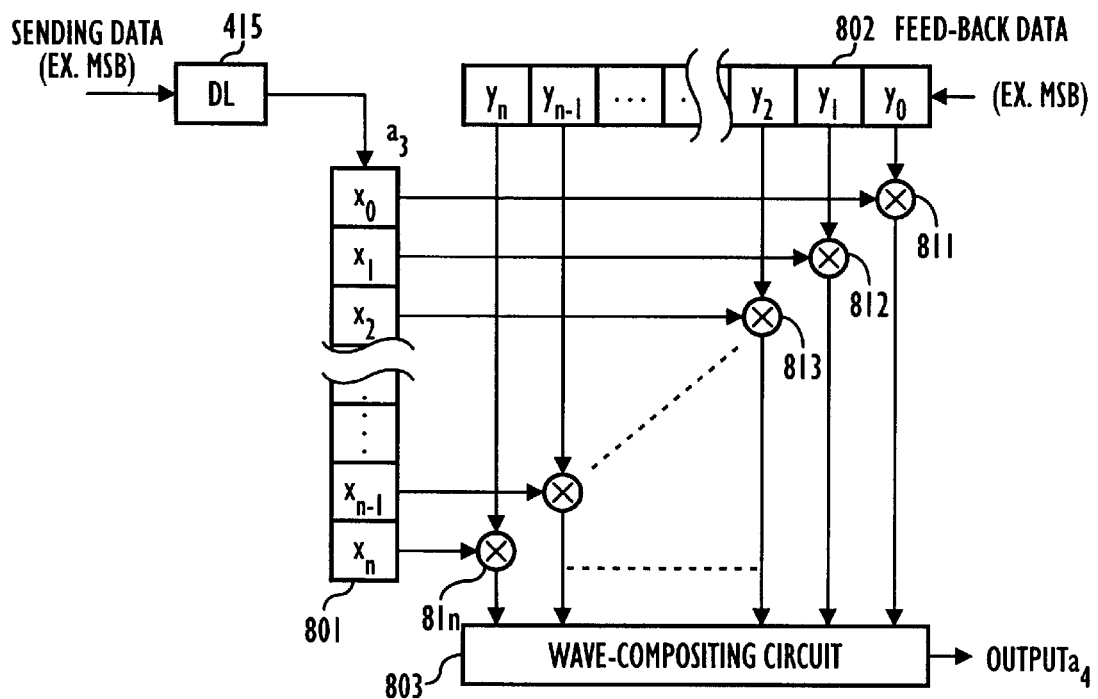
FIGS. 26A and 26B show a structural example of a phase shifter.

The correlator 170 detects to what part of the downward sending data the data fed-back by the amplifier 150 is corresponding. As shown in FIG. 26A, the correlator 170 comprises a plurality of multipliers 811 to 81*n* for multiplying the outputs of each stage of a shift register 801 for X direction, to which data, for example, MSB, is inputted via a delay line 415, a shift register 802 for Y direction, to which MSB of data fed-backed by the amplifier 150 is inputted, a shift register 801 for X direction, and a shift register 802 for Y direction and a wave composite circuit 803 for compositing the outputs of the plurality of multipliers 811 to 81$n$.

Figure 26B:
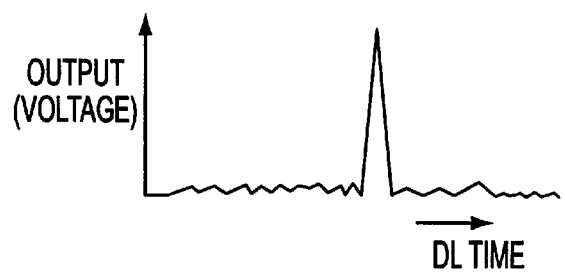

Accordingly, a peak output $a_4$ appears when the sending data coincides with the fed-back data from the wave compositing circuit 803 (refer to FIGS. 26B and 27D). The peak output $a_4$ is inputted to the timing generator 171, and the timing signals $a_1$ and $a_2$ are output at the timing (refer to FIG. 27E).

A method for directly transmitting radio frequency with an analog optical fiber is put to practical use as a method for connecting a radio base station and an advanced base station, which handles radio frequencies. However, it is general to generate the distortion in the E/O or O/E convertor, so that it cannot be sent with large power and large number of waves.

Then, a method for replacing a stage for amplifying radio frequency power with an analog optical fiber transmission path, such as a system including an E/O convertor, an optical fiber and an O/E convertor or a system including an E/O convertor, an optical fiber, an O/E convertor, and a power amplifier 150, and similarly non-linear compensating the feed-back signal sent from the power amplifier 150 with the analog optical fiber transmission path is employed as well as a feed back signal sent from the power amplifier 150. Thereby, it becomes possible to perform nonlinear compensation the distortion of the optical transmission path and the distortion of a high power amplifier.

Figure 28:
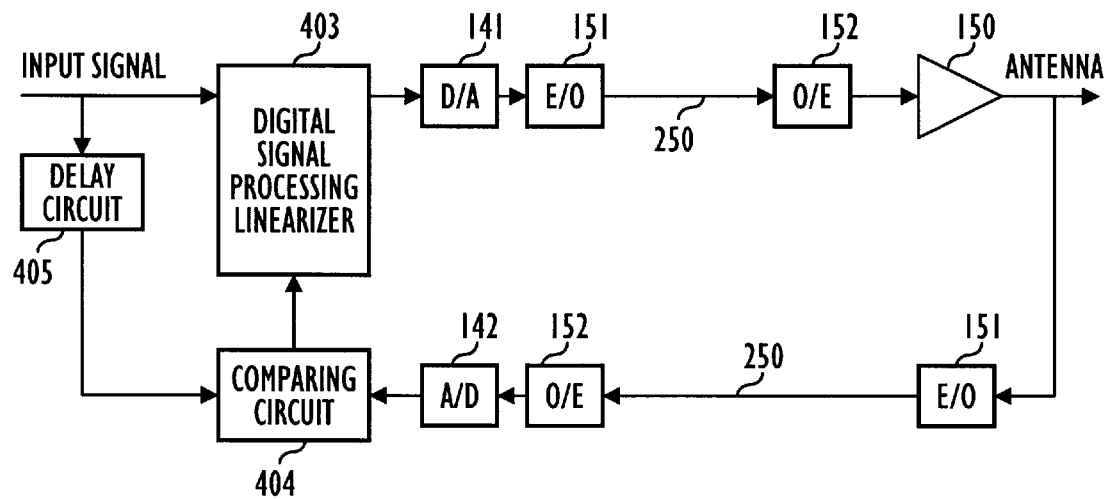
FIG. 28 shows a block diagram of a sixth embodiment of a base station for radio communication according to the present invention.

FIG. 28 shows a block diagram of a sixth embodiment of a base station for radio communication according to the present invention. More particularly, it shows a structural example, in which the stage for power-amplifying in radio frequency is replaced to the analog optical fiber transmission path, as described above. In FIG. 28, an E/O convertor 151 converts the output of the D/A convertor 141 to an optical signal in downward direction. Further, in the advanced base station, an O/E convertor 152 converts the optical signal sent via the analog optical fiber 250 to an electrical signal, and the converted signal is inputted to the power amplifier 150.

In the advanced base station, the E/O convertor 151 converts the signal fed-back by branching from the power amplifier 150 to an optical signal. The converted signal is sent to the side of the radio base station via the analog optical fiber 250, and converted to an electrical signal by the O/E convertor 152.

Figure 29:
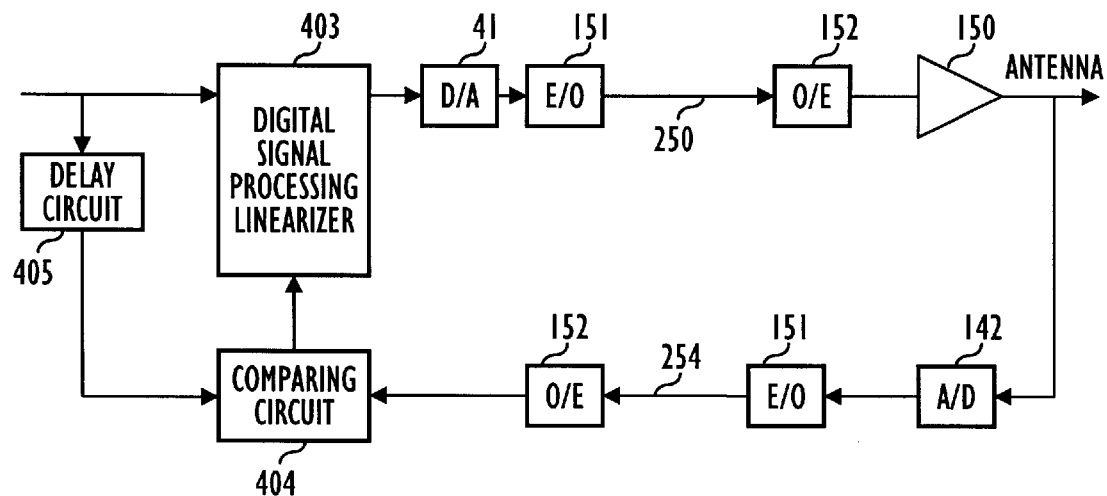
FIG. 29 shows a block diagram of a seventh embodiment of a base station for radio communication according to the present invention.

FIG. 29 is a block diagram showing a seventh embodiment of a base station for radio communication according to the present invention. In the embodiment shown in FIG. 28, the fed-back signal sent from the power amplifier 150 is transmitted in the analog optical fiber 250, similarly in a main path. However, as the same distortion is generated, the fed-back signal is converted by the A/D convertor 142 to a digital data, as shown in FIG. 29. The digital data is converted to an optical signal, and transmitted by the digital optical fiber 254. That can solve the problem of the distortion.

Figure 30:
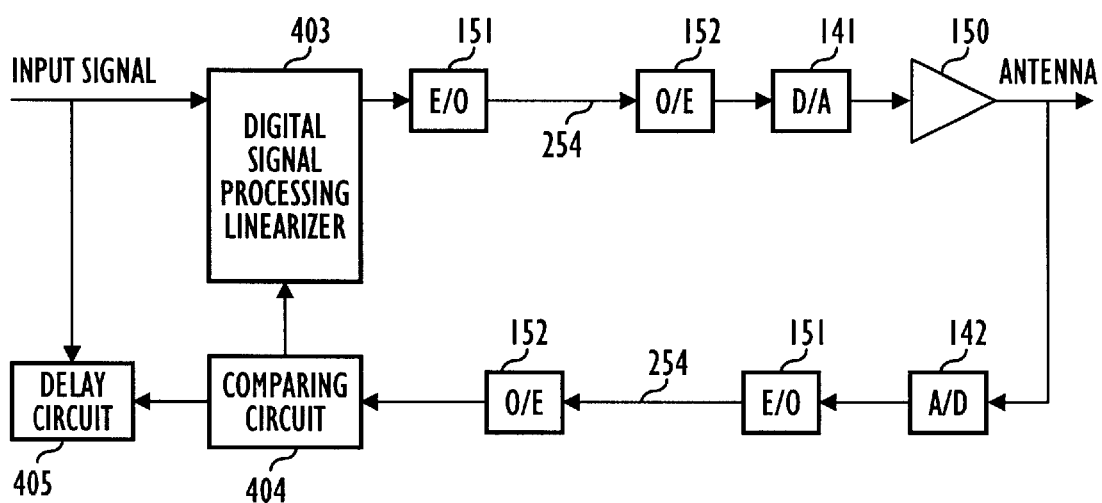
FIG. 30 shows a block diagram of an eighth embodiment of a base station for radio communication according to the present invention.

Further, in a method for transmitting the analog signal to an optical fiber, elements, such as laser diode, photo diode and the like constructing an E/O or O/E convertor have nonlinear characteristic. Therefore, it is impossible to send large power because of large distortion. For this reason, as shown in FIG. 30, both of the upward and downward paths are formed of digital fibers 254.

The digital optical fiber transmission paths 254 are connected to interface circuits, for example, a bus of 12 bits for the D/A convertor 141, between the A/D convertor 142 of the fed-back signal sent from the power amplifier 150 and the linearizing circuit 403.

With this method, problems of instability or distortion peculiar to the analog circuit can be solved.

It is possible to perform nonlinear compensation with the above-described method employing the optical fiber transmission paths. However, it is general that the data is bulky, for example, 12×50=600 Mbp. Thought the digital circuit is cheaper than the analog circuit, it is not economical to transmit several Km.

Figure 31:
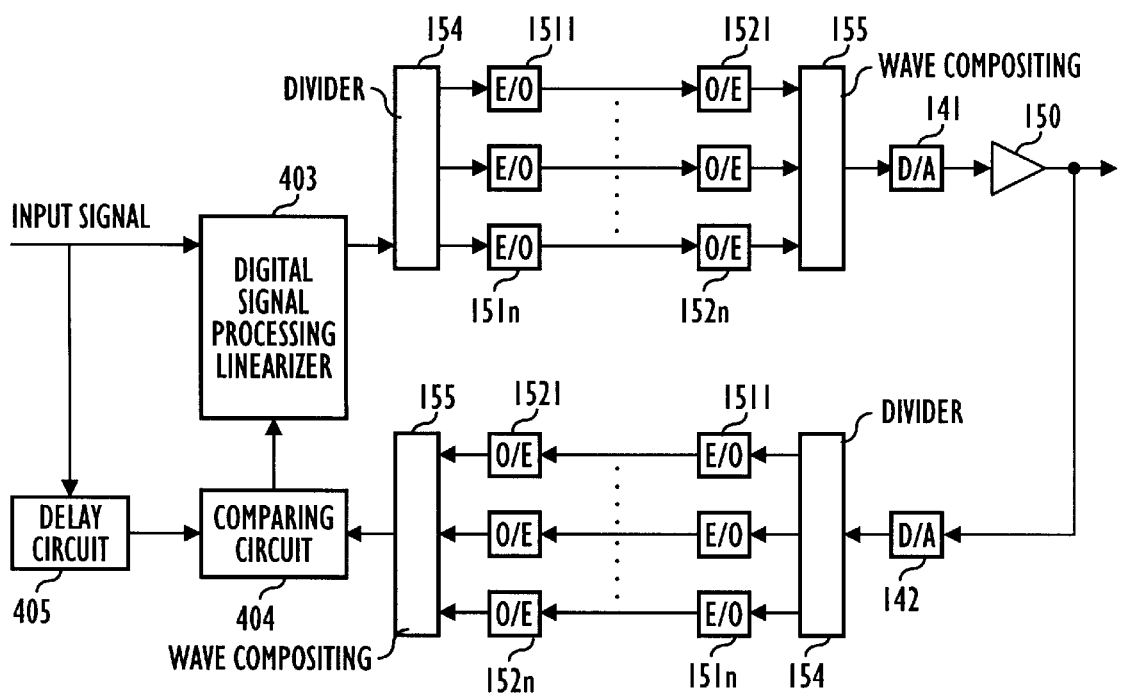
FIG. 31 shows a block diagram of a ninth embodiment of a base station for radio communication according to the present invention.

Then, in a ninth embodiment of a base station for radio communication according to the present invention, which is shown in FIG. 31, a plurality of optical fibers are prepared for transmission. The optical signals through a divider 154 transmits optical signals through a plurality of a low-speed optical fiber transmission paths. Further, in the advanced based station, after the optical signals sent from the plurality of the low-speed optical fiber transmission paths are converted to electrical signals by the wave-compositing circuit 155, the converted signals are composited in the wave-compositing circuit 155 to the signal having the original clock speed.

Figure 32:
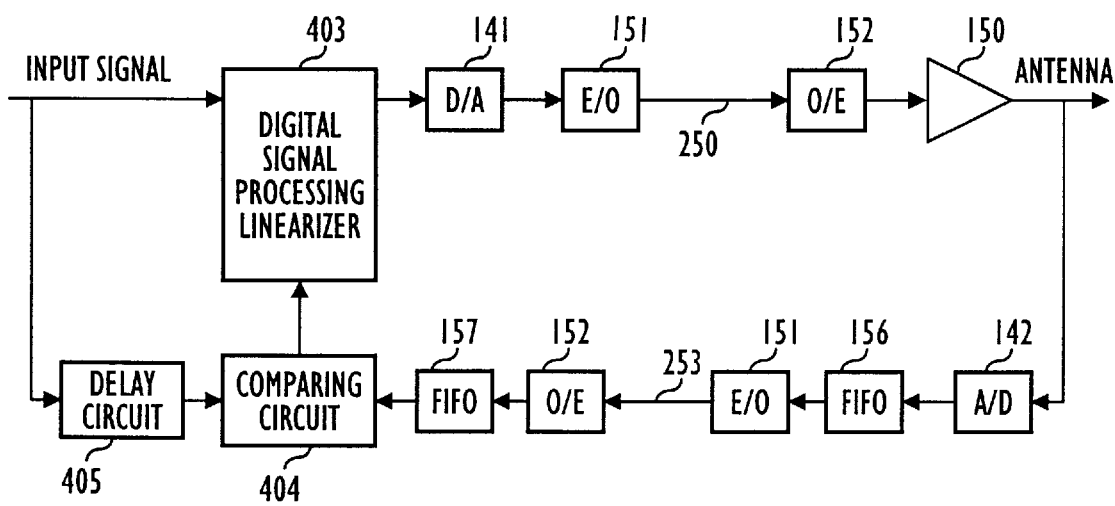
FIG. 32 shows a block diagram of a tenth embodiment of a base station for radio communication according to the present invention.

In other mode, as shown in FIG. 32, it is possible to convert a high speed signal to a low speed signal by employing a FIFO (First In and First Out) memory. In the structure shown in FIG. 32, the FIFO memory 156 converts a digital data, which is an output of the A/D convertor 142, obtained by converting with the original pre-described clock speed for a constant interval, to a low-speed signal, for example, a signal of 600 Mbs is sampled for one second, and the sampled signal is transmitted with 6 Mps, which is $\frac{1}{100}$, for 100 seconds.

As the cost of the digital circuit to the extent of 6 Mbps is very cheap, that brings an effectiveness in constructing more cheaper advanced base station.

Figure 33:
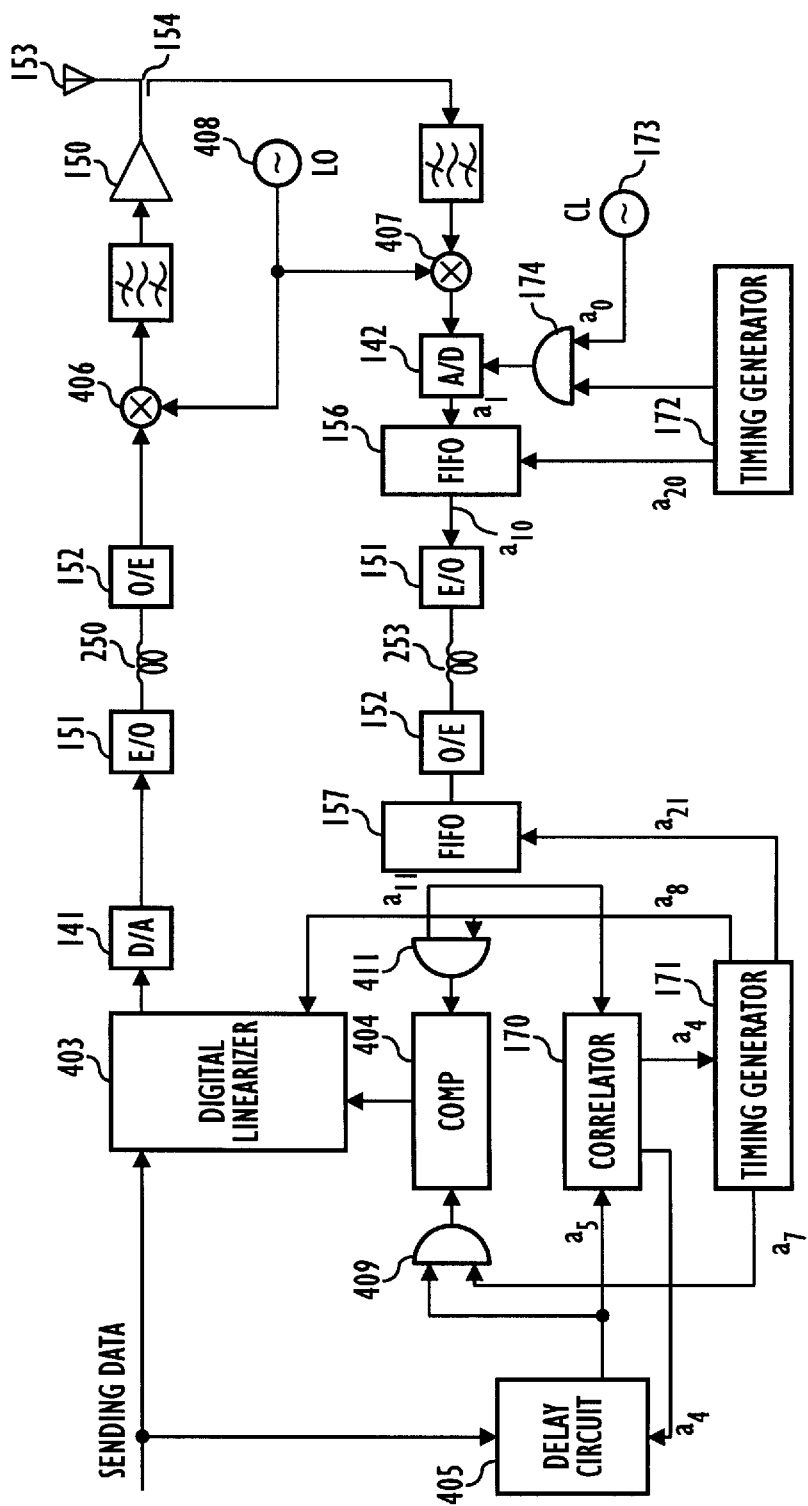
FIG. 33 shows a detailed structural block diagram corresponding to FIG. 32.
Figure 34:
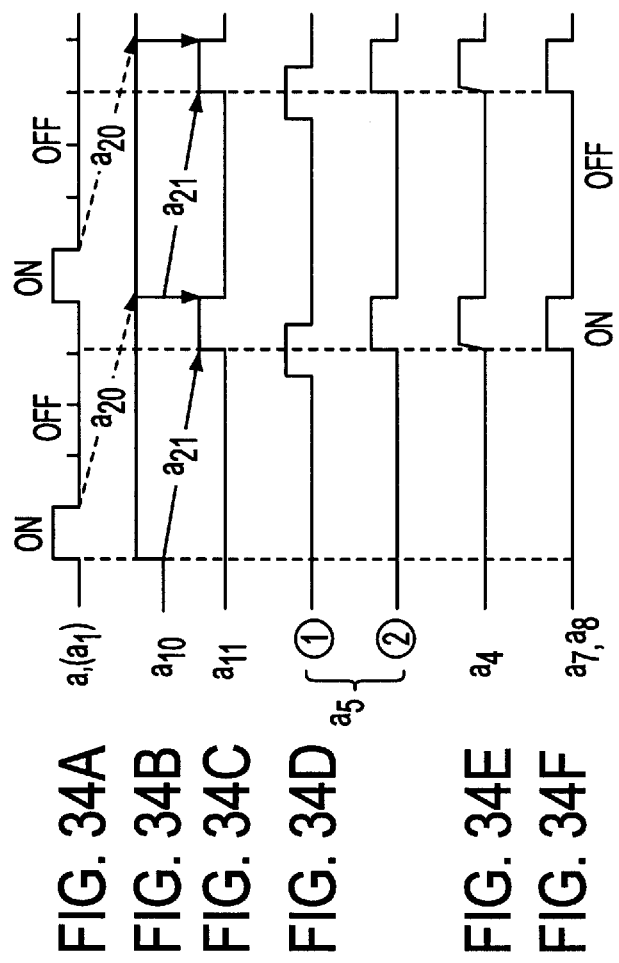
FIGS. 34A through 34F show time charts of timings shown in FIG. 33.

FIG. 33 shows an embodiment of employing the speed conversion, i.e., a detailed block diagram corresponding to FIG. 32. Further, time charts of each timing corresponding to FIG. 33 are shown in FIGS. 34A to 34F.

The A/D convertor 142 operates with the timing of a clock $a_0$, which is an output of the AND gate 174. Under the operation, data is accumulated in the FIFO memory 156. Then, the accumulated data is read out with the timing of $a_{20}$, and read with the low-speed during an interval $a_{10}$.

The data read from the FIFO memory 156 is converted to the optical signal by the E/O convertor 151, and sent via the digital optical fiber 253. Further, the O/E converter 152 converts the converted signal to the electrical signal to write in the FIFO memory 157. Then, the signal is read on timing of $a_{21}$, and finished reading on timing of $a_{11}$.

In FIG. 33, it is apparent from time charts shown in FIGS. 34A to 34F that the operations other than the above-described operations are the same as those shown in FIGS. 25 and 27, and the explanation will be abbreviated for simplicity.

Figure 35:
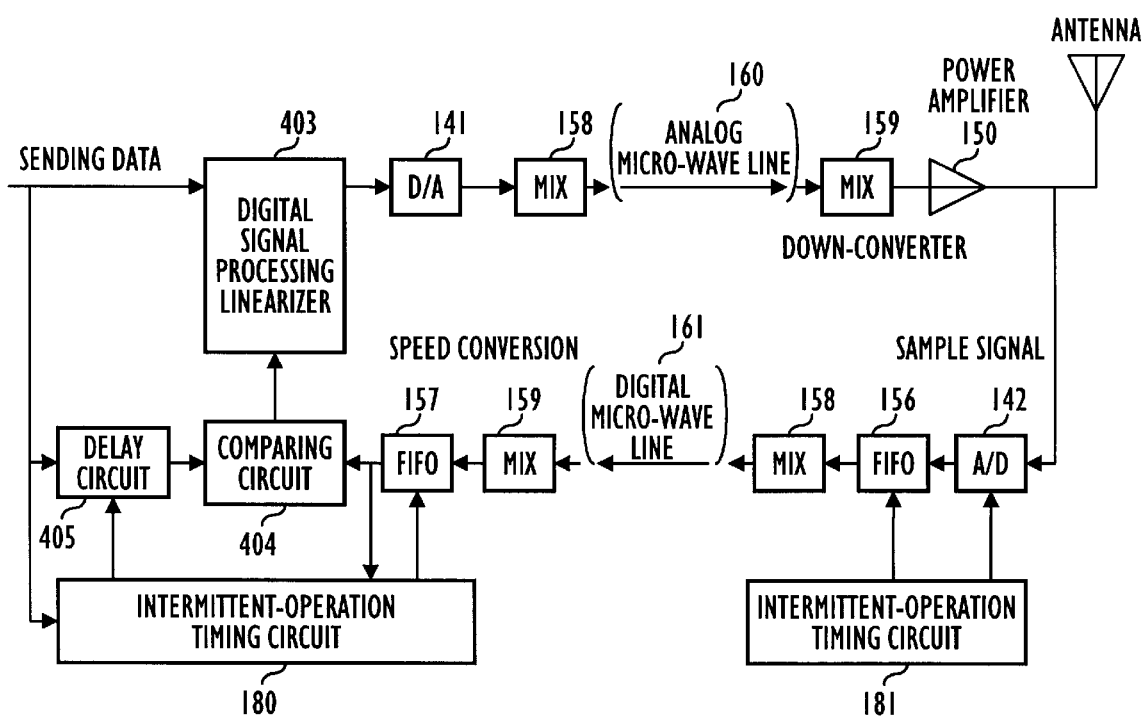
FIG. 35 shows a block diagram of an eleventh embodiment of a base station for radio communication according to the present invention.

When an optical fiber is employed as a transmission path, it is required to bury the transmission path under ground. However, if the transmission can be performed with a micro wave line, such as a submillimeter wave, there is no need to bury the path under ground, and a system can be constructed with low cost. FIG. 35 shows a block diagram showing an embodiment of the above-described system.

The difference between the above-described embodiments and the embodiment shown in FIG. 35 is to use micro wave lines 160 and 161 as transmission paths. When transmitting with the micro wave lines, there is a possibility of having an influence of the distortion, if the method for converting the fed-back signal sent from the power amplifier 150 with the analog micro wave lines is employed. Therefore, in the example of FIG. 35, the digital micro wave line 161 is employed to transmit the digital data in downward direction.

Further, transmission of a high-speed digital data in a radio channel causes high cost of devices, and it is of no practical use. Accordingly, in FIG. 35, similarly with the fifth embodiment of the base station for radio communication according to the present invention shown in FIG. 24, it becomes possible to drop transmission speed by providing intermittent-operation timing circuits 180 and 181.

On consideration of a multi-carrier common amplifier, there is no need to set saturation power of the power amplifier, until coming to the power when vectors of all carrier coincide. Further, it is reported that the saturation power can be reduced by depending on the amount of the desired distortion (D/U). For example, is described in [RCS-90-4: A super low distortion multi frequency common amplifier for mobile communication—a self-adjust type feed forward amplifier (SAFF-A) Nogima, Narahashi].

That means the multi-frequency composed level is approximately equal to Rayleigh distribution, the frequency of that signal power more than a certain level becomes an instant value is small, and the input signal may be limited to a constant level.

Figure 36:
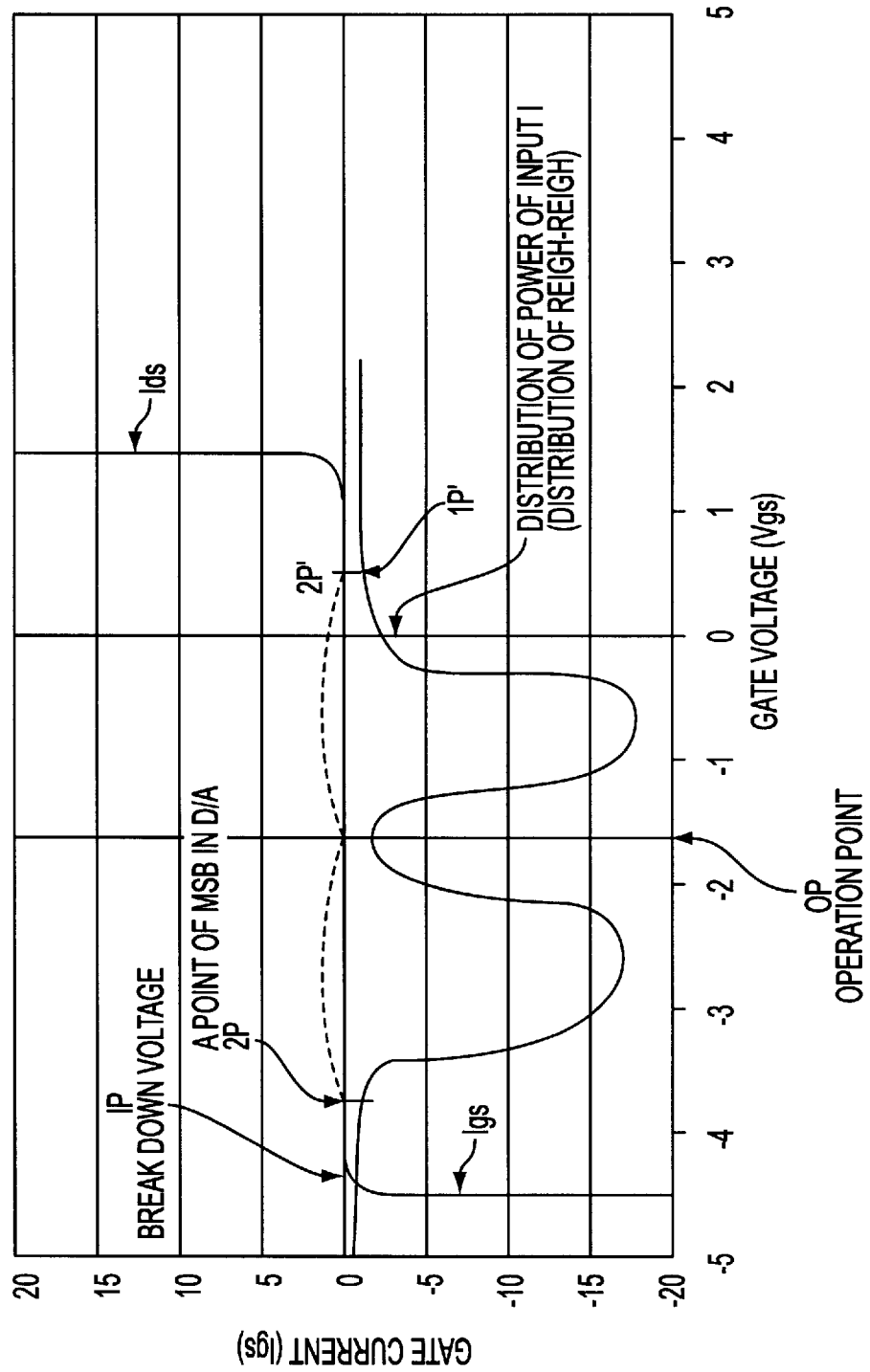
FIG. 36 is a diagram for explaining distribution of input signal power and current characteristic of semi-conductor device.

As one example, when the power amplifier 150 is formed by a FET, the gate voltage and the gate current will be considered as follows. In FIG. 36, an axis of abscissas shows a gate voltage (VgS), and an axis of ordinates shows a gate current (Igs). In FIG. 36, I is a Rayleigh distribution, which is a power distribution of input signals. The level distribution of the input signal power distributes in symmetrical to a deep curve and a shallow curve employed as an operation point OP as a center (symmetrical shift).

When a deeper voltage than a breakdown voltage 1P is applied, the gate current sharply increases, and that brings gate break-down. If MSB (maximum voltage) 2P of the D/A convertor is set immediately before the gate current sharply increases, the power applied to the FET element of the power amplifier 150 is always less than 2P, so that the deterioration of the element can be prevented. If 2P', which is symmetrical to 2P, is employed with the use of the operation point OP as a symmetrical shift, it should be of course that the 2P' be the point immediately before the break down point 1P'.

Figure 37:
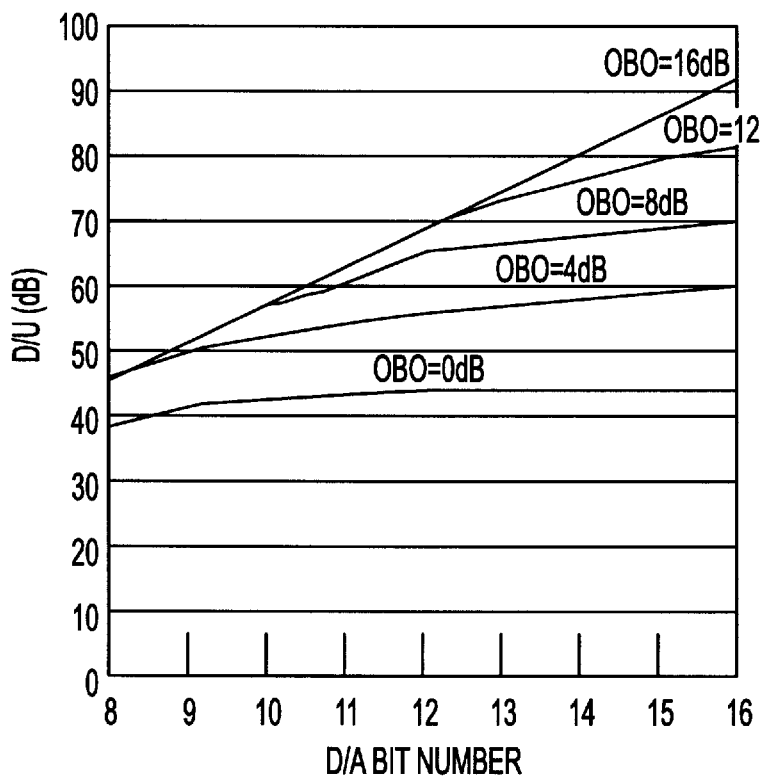
FIG. 37 is a diagram showing a relationship between accuracy of the D/A convertor and distortion of the amplifier.

Further, FIG. 37 shows the result obtained by simulating the relationship between accuracy (bit number) of D/A convertor and the distortion (D/U). As head-cutting is generated at a relatively small level, i.e., Output Back Off: OBO is small, the D/U is deteriorated. In this case, it is understood that the D/U is not improved, even if the accuracy of the D/A convertor increases.

On the other hand, when the amount of OBO is a larger size, as the accuracy of the D/A convertor is improved, the D/U is improved according to the accuracy.

It becomes apparent from the above-described that suitable D/A and A/D convertors can be used for the required D/U, which are not any expensive A/D and D/A convertors having more accuracy. Based on the relationship, more effective device can be obtained by designing the accuracy (bit number) of A/D and D/A convertors.

On the other hand, in the conventional radio base station for mobile communication, one transmitter is provided per one wave to generate a plurality of carrier waves. The transmitter section can be formed of several number of LSIs by employing a group modulator. Since the output of the group modulator is a digital signal of, for example, 12 bits, the digital signal is converted to an analog signal to be input to a large power amplifier.

Thereby, when employing the group modulator, it becomes possible to make the modulating section, a carrier compositing section, a power amplifying section and a linearizing circuit more compact, with light weight and low cost, by inserting a digital linearizer immediately before the D/A convertor, but not inserting a linearizer, for example, a feed-forward type linearizer, analogically.

Figure 38:
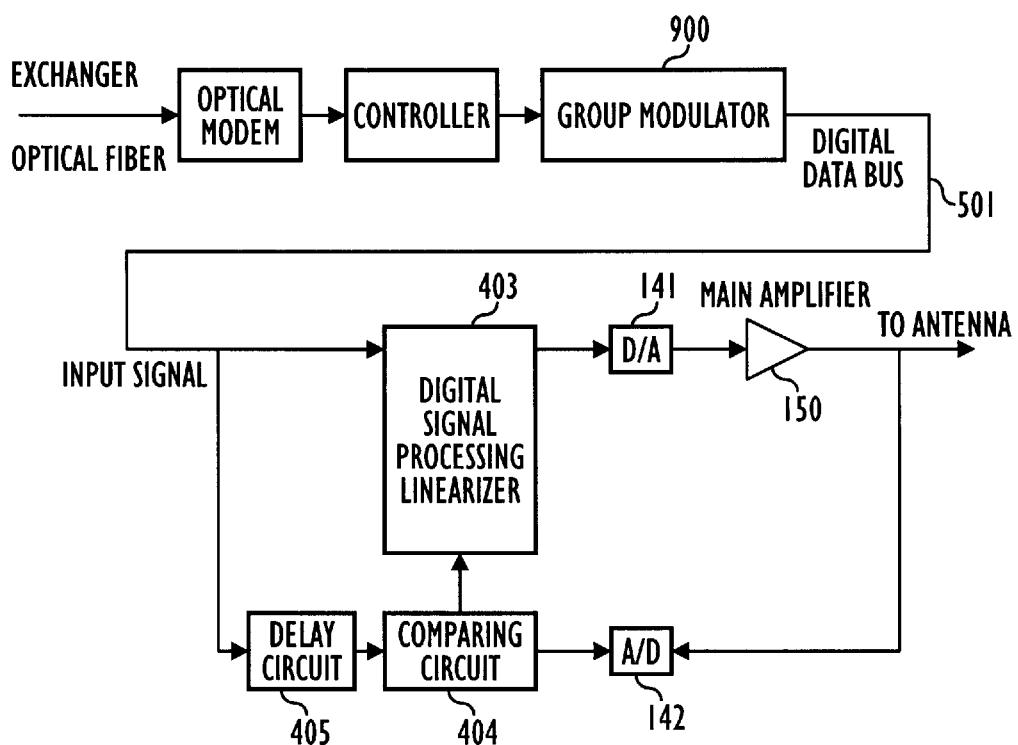
FIG. 38 is a block diagram of a twelve embodiment of a base station for radio communication according to the present invention.

FIG. 38 shows a block diagram of a twelveth embodiment of the present invention, which is constructed with the above-described concept. A digital data bus 501 connects an output of the group modulator 900 to a digital signal processor 403, and the digital signal processor 403 adds a distortion compensating value to the output and inputs the added output to the power amplifier 150.

Further, the group modulator 900 can be formed with, for example, a trans-multiplexer and a digital orthogonal modulator.

Generally, the power amplifier 150 gives a limitation to the level more than the amount of the OBO. Therefore, an instant value of the spectrum deteriorates 20 to 30 dB extent from an average value. The instant value can be measured by switching a spectrum analyzer to a peak holding mode.

Spectrum is usually measured on an average. Therefore, there is no problem of the instant value. However, if the instant value can be reduced, the average D/U can be further improved.

As the digital processor can judge the level of input signals, it is further possible to obtain effectiveness of improving the instant value of the spectrum by shaping the clipped waveform smoothly, when the level exceeds the maximum level of the D/A convertor, supposing here that the MSB of the D/A convertor is set as to be saturated power.

Figure 39:
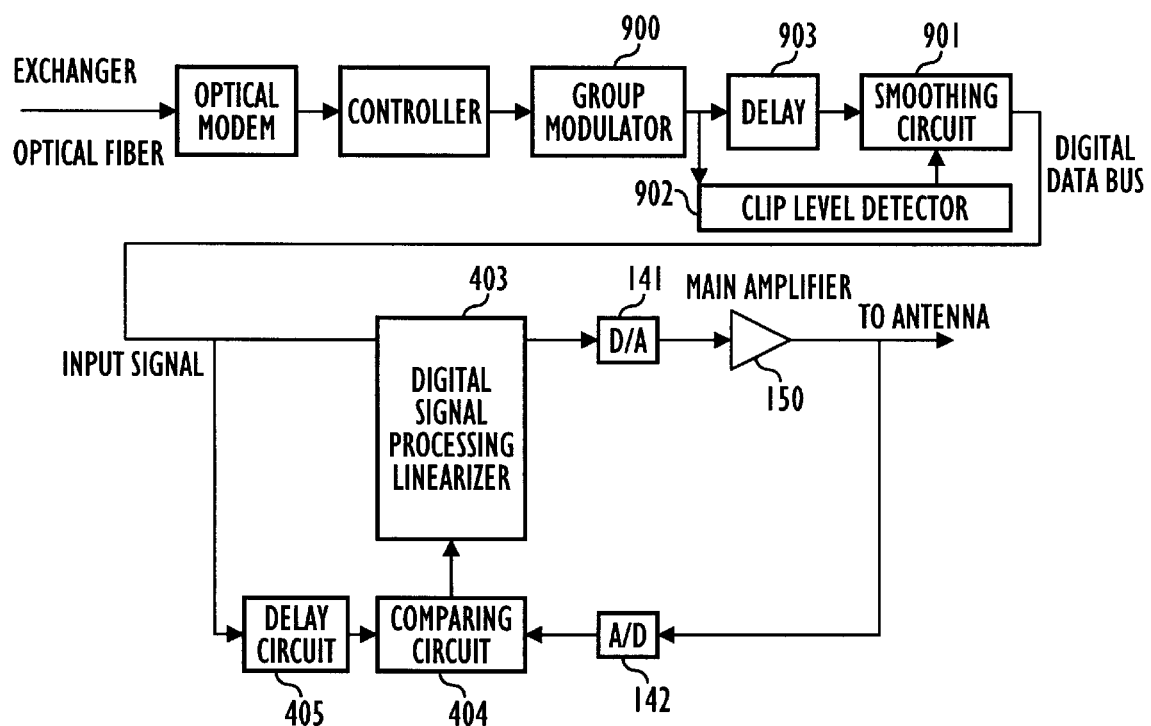
FIG. 39 is a block diagram of a thirteenth embodiment of a base station for radio communication according to the present invention.

FIG. 39 is a block diagram of a thirteenth embodiment of a base station for radio communication of the present invention in order to obtain the above-described effectiveness. As compared with the structure shown in FIG. 38, the circuit shown in FIG. 39 has further a clip level detector 902 and a smoothing circuit 901 between the group modulator 900 and a digital signal processor 403. Further, a delay circuit 903 adjusts the timing of an operation of the smoothing circuit 901 to a processing time of the clip level detector 902.

FIG. 40A is a block diagram showing a structural example of the delay circuit 903, the smoothing circuit 901 and the clip level detector 902 shown in FIG. 39. FIGS. 40B and 40C respectively show levels of coefficients $a_0$ and $a\pm 1$ . . . $a\pm n$. In FIG. 40, the smoothing circuit 901 basically forms a transversal filter.

Figure 41:
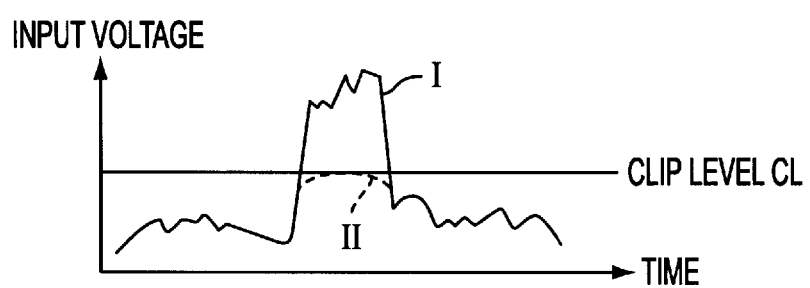
FIG. 41 is an explanatory diagram of clip-level detection.

FIG. 41 is a diagram for explaining a clip level detection. As shown in FIG. 41, when an input voltage amplitude I exceeds a clip level CL, the level detector 902 detects the exceeded level.

On the other hand, the smoothing circuit 901 includes multipliers $91n$ . . . 910 . . . $91n$ for multiplying weighted coefficients $a_n, a_{n-1}, \ldots a_1, a_0, a_{-1}, \ldots a_{-n}$ obtained from a tap-weight controller 904, an accumulator 907 and a multiplier 906, for each step of a nth shift register 905, a tap-weight controller 904, a shift register 905.

When the level detector 902 detects that the input voltage amplitude I exceed s the clip level CL, a predetermined weight coefficient is outputted from the tap-weight controller 904. Then, a value of each step of the shift register 905 is multiplied with the predetermined weighted coefficient and composited by inputting the output to the accumulator 907. As the result, the composite value is smoothed to a waveform shown with a dotted line II of FIG. 41.

Further, the output of the accumulator 907 is inputted to the multiplier 906 to multiply with a coefficient b. The coefficient b makes a central level $a_0$ of a tap to $1/n$, as shown with a curved line I. The level coincides with the front and rear levels of the tap $a_1, a_{-1}, \ldots a_n, a_{-n}$.

Figure 42:
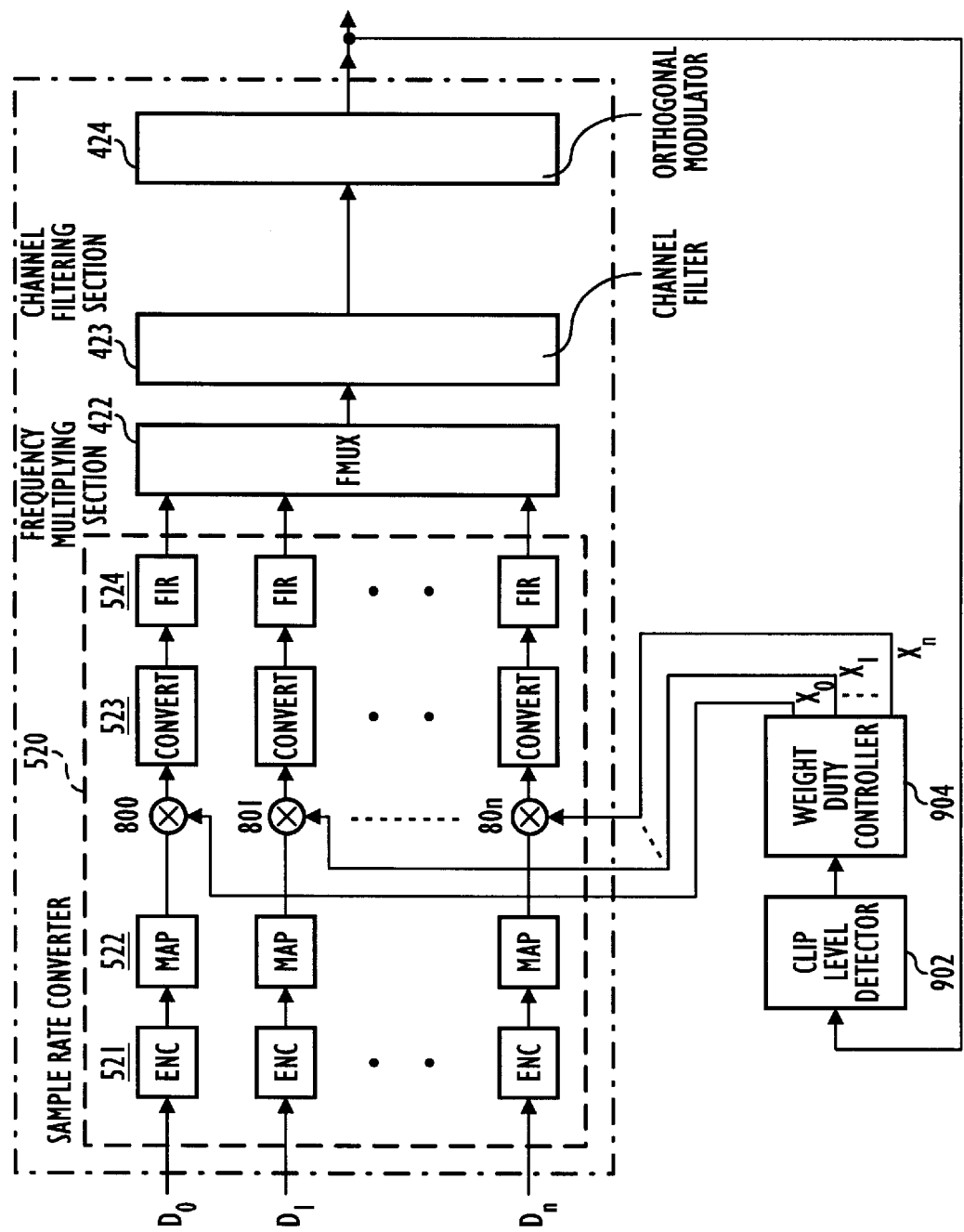
FIG. 42 is a diagram for explaining other structural example of clip compensation.

In the above-described mode shown in FIG. 27, a high-speed digital transversal filter is required. FIG. 42 shows other structure of the clip compensation. In the structure shown in FIG. 42, the level detector 902 always monitors the output of the group modulator formed of a sample rate convertor 420, a frequency multiplexer 422, a channel filter 423 and an orthogonal modulator 424.

When it becomes clear to be a level of amplitude, which exceeds the MSB of the D/A convertor, the amplitude of each carrier wave is reduced equally or unequally. In the above-described structure, a tap-weighted controller 904, which is also employed in FIG. 40A, is employed, and the multipliers 800 to 80$n$ of the sample rate convertor 520 multiplies the output sent from the controller 904 with the output from a mapping section 522.

In this way, on the previous stage of the roll off filter 524, reduction of amplitude is performed. As a limitation of wave band width with the use of the base band roll off filter of each carrier is performed, it is possible to process with low-speed. As it is also performed ideally to clip voltages, it becomes possible to perfectly suppress a deterioration of an instant spectrum in a peak holding mode.

Further, as shown in the structural example shown in FIG. 3, a digital signal processor 403 in the linearizer 402 stores a distortion compensating data in a RAM memory. However, an initial value of the distortion compensating data is not constant, and therefore, the distortion immediately after starting the operation cannot be compensated.

Figure 43:
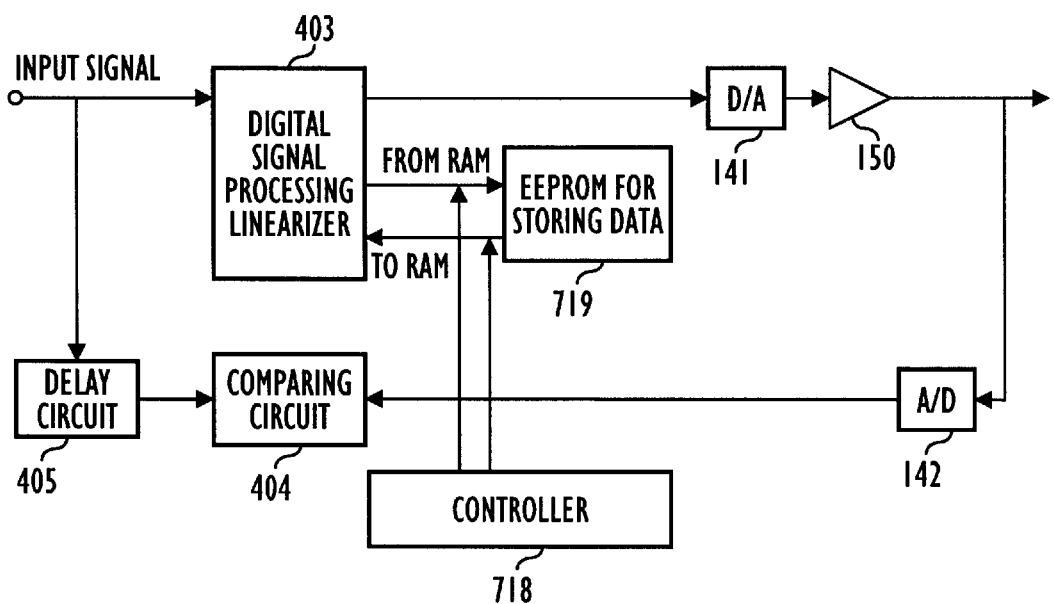
FIG. 43 is a block diagram of a fourteenth embodiment of a base station for radio communication according to the present invention.

Accordingly, in the fourteenth embodiment of the base station for radio communication according to the present invention, a non-volatile memory 719 is provided to store data, as shown in FIG. 43. When delivering the devices to customers from a factory, test operation is performed in advance to obtain an end data. The end data is stored in the non-volatile memory 719. Then, the end data is installed to a memory, such as a RAM provided in the linearizer 403, immediately before actual operation. Thereby, it becomes possible to converge with very short time for actual operation.

Further, there is a case where the distortion data varies according to change in time under operation. In this case, the controller 718 evacuates data in the RAM to the non-volatile memory 719, immediately before stopping the operation due to a periodical maintenance or the like by the controller 718 to compensate a smoothly operation on the time of next operation.

Figure 44A:
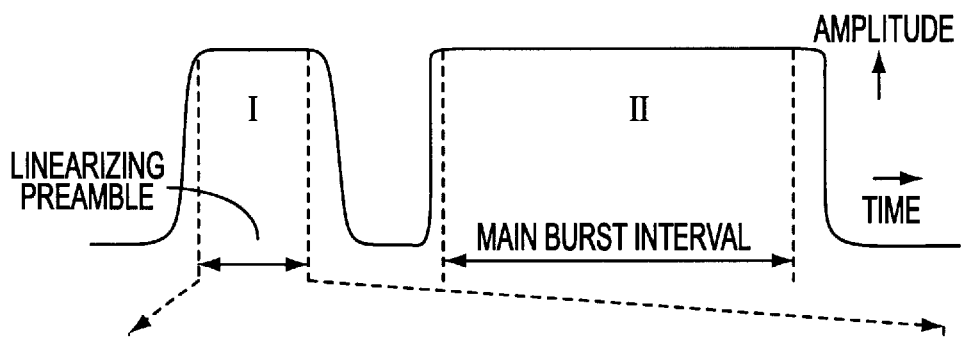
FIGS. 44A through 44C are diagrams explaining an example of a preamble waveform.
Figure 44B:
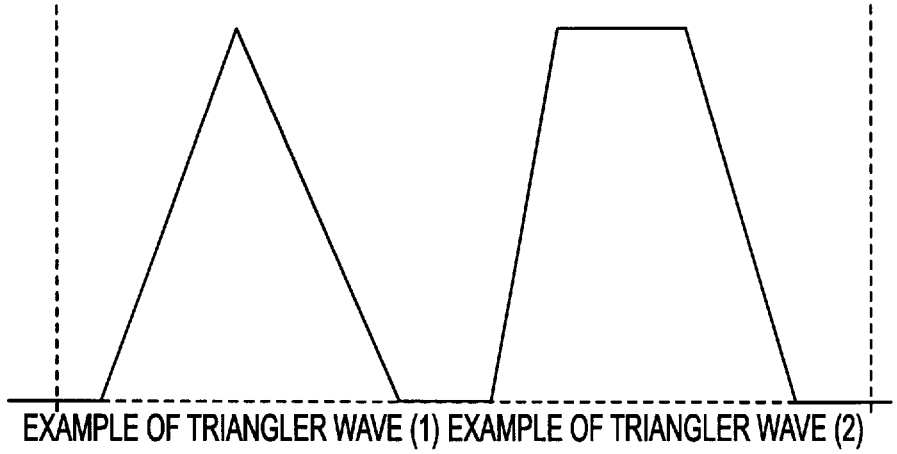
Figure 44C:
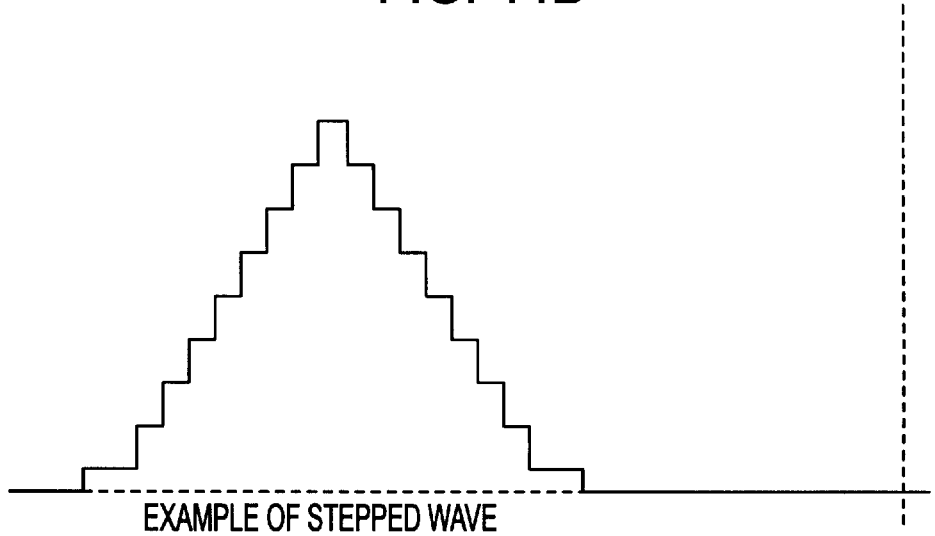

When the input signal is a TDMA signal (1 carrier wave), which has a burst signal, a shorter preamble burst is transmitted immediately before the burst signal begins, and a linearized data is created according to the preamble burst. As shown in FIGS. 44A to 44C, data can be obtained with very short time according to a simple increasing function, which has a range between 0 to the maximum value or a stepwise wave.

FIG. 44A shows a relationship between a preamble interval I and a main burst interval II. FIG. 44B shows an example of a triangular wave function, which increases and decreases linearly. Further, FIG. 44C shows an example in a case of employing a stepwise wave function.

Figure 45:
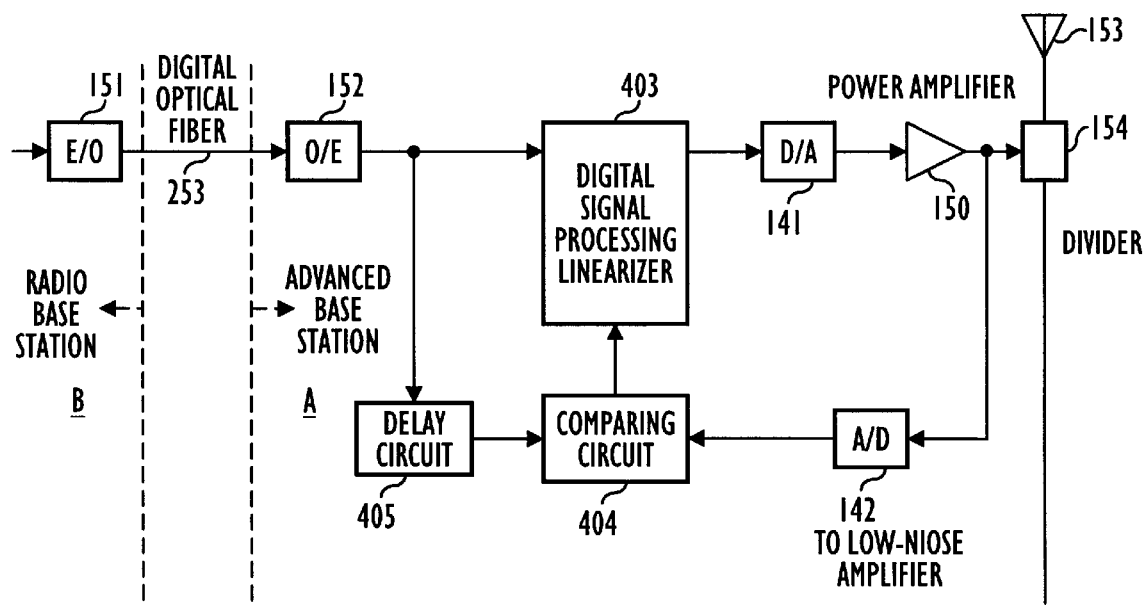
FIG. 45 shows a block diagram of a fifteenth embodiment of a base station for radio communication according to the present invention.

However, it is economical to perform a linearizing operation for distortion compensation of an amplifier in the advanced base station, because there is no need to feed signals back to a main base station through transmission paths. FIG. 45 is a block diagram showing a fifteenth embodiment of the present invention.

A digital signal processor 403 is provided on the advanced base station, in which an antenna 53 is installed.

Figure 46:
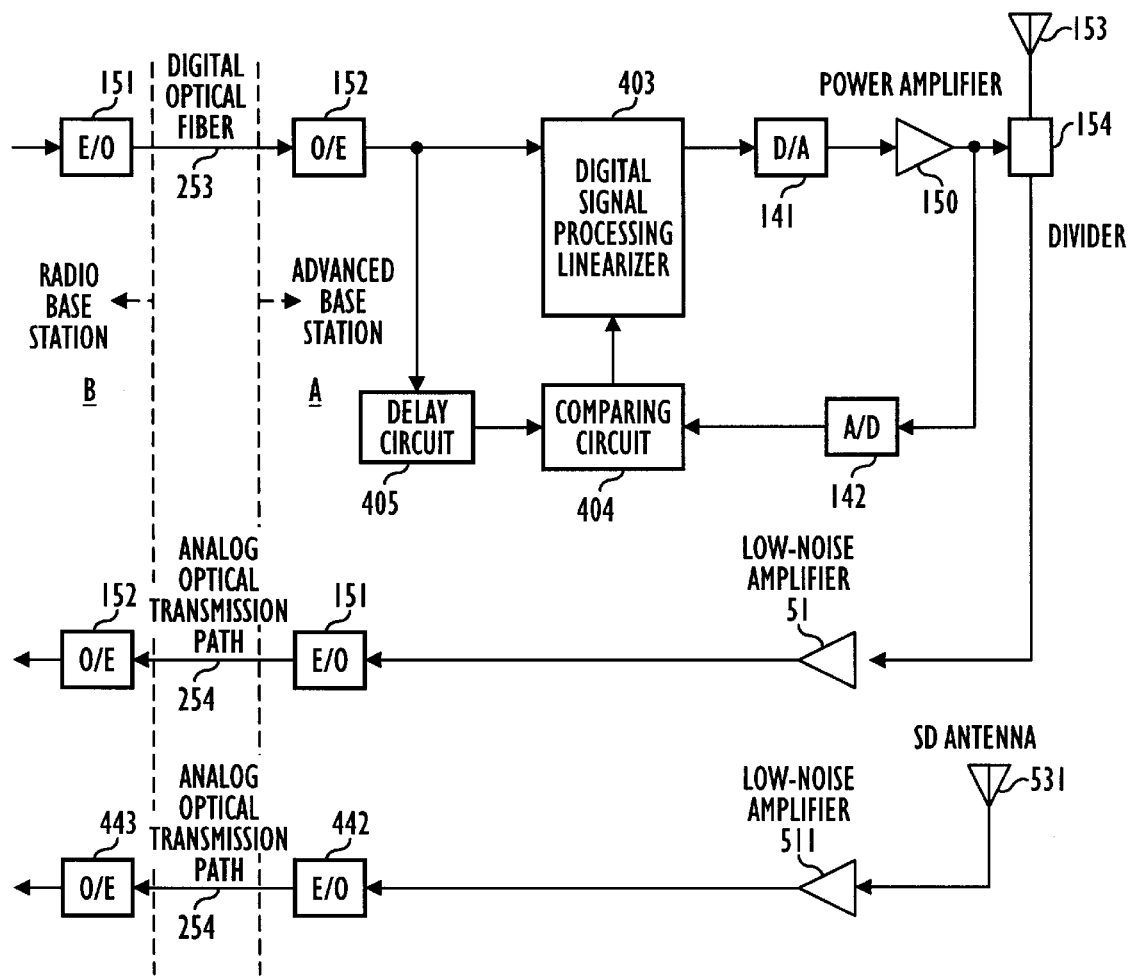
FIG. 46 shows a block diagram of a sixteenth embodiment of a base station for radio communication according to the present invention.

Further, as shown in FIG. 46, which shows a sixteenth embodiment of a base station for radio communication according to the present invention, space diversities transmit upward signals to the base station with a plurality of analog optical fiber transmission paths 254. Further, transmission paths for upward signals can be also provided by the analog micro wave transmission path instead of the analog optical transmission path. Thereby, it is possible to improve a super compact radio base station.

Figure 47:
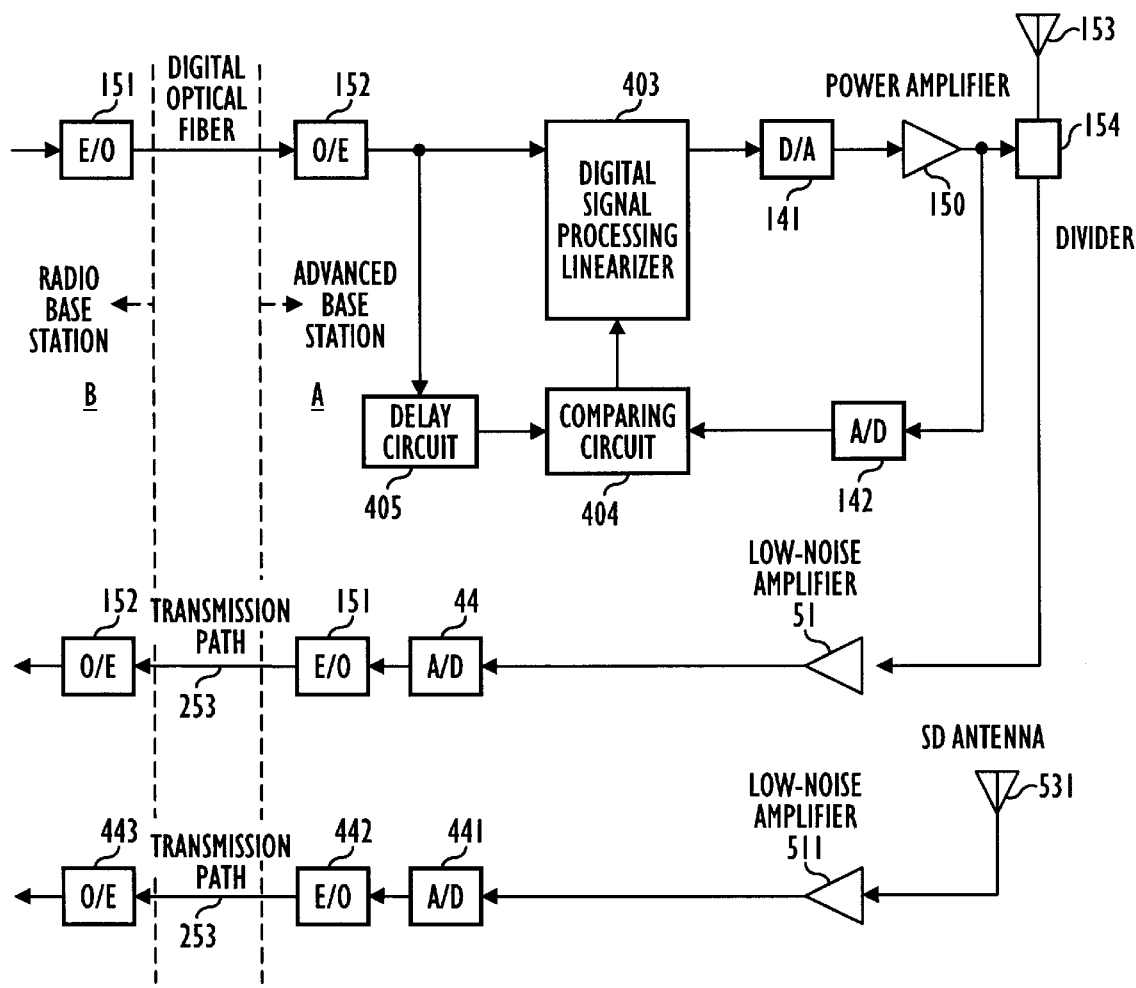
FIG. 47 shows a block diagram of a seventeenth embodiment of a base station for radio communication according to the present invention.

Further, as shown in FIG. 47, if high accuracy and high speed of the A/D convertor 441 can be obtained, it becomes possible to replace the analog transmission path 254 to a digital transmission path 253. Therefore, it becomes possible to form transmission paths with low cost, high stability and high quality.

As explained according to the above-described embodiments, a base station for radio communication according to the present invention employs image rejection type frequency convertors as up and down convertors to make it easy to suppress useless side band. Further, the image rejection type frequency convertor needs a 90 degree phase shifter. If the ratio base band ratio is large, it becomes difficult to employ a passive circuit. However, in the present invention, it becomes possible to easily construct a base station by using a digital signal circuit.

The present invention may be embodied in other specific forms without departing from the spirit or essential characteristics thereof. The present embodiment is therefore to be considered in all respects as illustrative and not restrictive, the scope of the invention being indicated by the appended claims rather than by the forgoing description and all changes which come within the meaning and range of equivalency of the claims are therefore intended to be embraced therein.

What is claimed is:

1. An amplifier having distortion compensation comprising:
    an amplifier circuit for amplifying an input signal;
    an error detecting circuit for obtaining an error signal between the input signal to and an output signal from the amplifier circuit;
    a coefficient generating circuit for generating compensation coefficients to compensate distortion components of characteristics of the amplifier circuit, based on the error signal according to an adaptive type algorithm;
    a first outputting circuit for outputting a generated compensation coefficient corresponding to the input signal; and
    a multiplying circuit for multiplying the generated compensation coefficient to the input signal and inputting a multiplied coefficient to the amplifier circuit.

2. The amplifier according to claim 1,
    wherein said first outputting circuit outputs a distortion compensation coefficient corresponding to the amplitude of the input signal.

3. The amplifier according to claim 1,
    wherein said first outputting circuit outputs a distortion compensation coefficient corresponding to the power of the input signal.

4. The amplifier according to claim 1,
wherein said first outputting circuit outputs a distortion compensation coefficient corresponding to the function of the amplitude of the input signal.

5. The amplifier according to claim 1,
wherein said first outputting circuit outputs a distortion compensation coefficient corresponding to the function of the power of the input signal.

6. The amplifier according to claim 1,
wherein the distortion compensation coefficient corresponding to the input signal is outputted as the form of a complex number.

7. The amplifier according to claim 1,
wherein the adaptive type algorithm is a LMS adaptive algorithm.

8. The amplifier according to claim 1,
wherein the adaptive type algorithm is a RLS adaptive algorithm.

9. The amplifier according to claim 1, further comprising:
an orthogonal signal modulator on the input side of the amplifier circuit; and
an orthogonal signal demodulator for demodulating a signal branched from the output of the amplifier circuit;
wherein the adaptive type algorithm is an adaptive algorithm employing quadrant information of a demodulated complex signal output from the orthogonal signal demodulator.

10. The amplifier according to claim 1, further comprising,
a circuit operatively connected to the coefficient generating circuit for calculating a compensation coefficient generated from the coefficient generating circuit according to a predetermined function, and interpolating the generated compensation coefficient with a compensating coefficient obtained by the calculation.

11. The amplifier according to claim 10,
wherein the predetermined function is a primary function.

12. The amplifier according to claim 1, further comprising,
a second outputting circuit for outputting an initial value of a distortion compensation coefficient, and multiplying the initial value to the input signal, before the first outputting circuit outputs the generated compensation coefficient in correspondence with the input signal.

13. The amplifier according to claim 1, further comprising,
a control circuit for controlling to perform updating a compensation coefficient generated by the coefficient generating circuit and multiplying the compensation coefficient to the input signal independently in time.

14. The amplifier according to claim 13,
wherein said control circuit includes a dual port RAM, and updating of the compensation coefficient to the dual port RAM and reading of the compensation coefficient from the dual port RAM are performed independently in time.

15. The amplifier according to claim 1, further comprising an oscillator for generating a training signal, of which waveform gradually rises to a predetermined level and an estimation circuit for repeatedly receiving the training signal during a training period and sweeping the amplitude of the training signal within a predetermined range to estimate a distortion compensation coefficient.

16. The amplifier according to claim 1, further comprising:

an orthogonal signal modulator provided on the input side of the amplifier circuit;
an orthogonal signal demodulator for demodulating a fed-back signal branched from the amplifier circuit on the output side of the amplifier circuit; and
a compensating circuit for obtaining and compensating a DC offset in a group including the orthogonal signal demodulator and
gain deviation between I and Q channels, based on the maximum and minimum values of the demodulated signals output from the orthogonal signal demodulator.

17. The amplifier according to claim 16,
wherein the DC offset and the gain deviation between I and Q channels are compensated based on the maximum and minimum values obtained by outputting a unit circle from the orthogonal signal demodulator and detecting the maximum and minimum values of the I and Q channels.

18. The amplifier according to claim 17,
wherein the gain deviation between the I and Q channels detected by employing an adaptive algorithm.

19. The amplifier according to claim 16, further comprising an oscillator for generating a training signal of a unit circle on a complex plane, and an estimation circuit for repeatedly receiving the training signal during a training period and sweeping the amplitude of the training signal within a predetermined range to estimate a distortion compensation coefficient.

20. A base station for radio communication comprising:
a receiving and sending antenna;
a high-frequency power amplifier for amplifying and sending out a transmission signal via the receiving and sending antenna;
an A/D convertor for converting a part of the output of the high-frequency power amplifier to a digital signal;
a linearizing circuit provided on the input side of the high-frequency power amplifier, for compensating an amplitude and a phase of the transmission signal so as to reduce a difference obtained by comparing an input signal and the output of the A/D convertor; and
an image rejection type frequency up-convertor provided between the linearizing circuit and the high-frequency power amplifier including:
a first phase shift circuit for shifting a phase of an output of the linearizing circuit for 90 degrees,
a first D/A convertor for converting an output of the phase shift circuit to a first corresponding signal,
a second D/A convertor for converting an output of the linearizing circuit directly to a second corresponding signal, and
first and second mixing circuits for employing the first and second corresponding signals out of the first and second D/A convertors as Ich and Qch orthogonal signals and mixing the Ich and Qch orthogonal signals with oscillating signals which have higher frequencies than the first and second corresponding signals out and of which phases are respectively shifted by 90 degrees.

21. A base station for radio communication comprising:
a receiving and sending antenna;
a high-frequency power amplifier for amplifying and sending out a transmission signal via the receiving and sending antenna;
an A/D convertor for converting a part of the output of the high-frequency power amplifier to a digital signal;

a linearizing circuit provided on the input side of the high-frequency power amplifier, for compensating an amplitude and a phase of the sending signal so as to make a difference zero, which is obtained by comparing an input signal and the output of the A/D convertor;

a wave divider for dividing the output of the high-frequency power amplifier; and an image rejection type frequency down-convertor provided between the linearizing circuit and the wave divider, including:

first and second mixers for mixing divided outputs of the wave divider respectively with first and second oscillating signals, of which frequency is lower than that of the divided outputs of the wave divider, and of which phases are respectively shifted by 90 degrees, first and second A/D convertors for converting the output of each of the first and second mixers to digital signals, and a phase shift circuit for shifting a phase of an output of the second A/D convertor by 90 degrees, wherein the outputs of the first mixer and the phase shift circuit are inputted to the linearizing circuit as Ich and Qch orthogonal signals, respectively, and compared with the input signal.

22. A base station for radio communication comprising:

a sending and receiving antenna;

a high-frequency power amplifier for amplifying a sending signal sent from the sending and receiving antenna;

an analog to digital convertor for converting a part of an output of the high-frequency power amplifier to a digital signal;

a linearizing circuit provided on the input side of the high-frequency power amplifier, for compensating an amplitude and a phase of the sending signal so that a difference obtained by comparing the inputted sending signal and the output of the analog to digital convertor is reduced;

an image type frequency up-convertor provided between the linearizing circuit and the high frequency power amplifier, including, a first phase shift circuit for shifting a phase of an output of the linearizing circuit for 90 degrees, a first digital to analog convertor for converting a digital output of the linearizing circuit to an analog signal, a second digital to analog convertor for converting a digital output of the linearizing circuit to an analog signal, and first and second mixers for mixing outputs of the first and second convertors as Ich and Qch orthogonal signals, respectively, with oscillation signals, of which phases are shifted for 90 degrees with a higher frequency than the Ich and Qch orthogonal signals;

a divider circuit for dividing an output of the high-frequency power amplifier; and an image rejection type frequency down-convertor provided between the linearizing circuit and the divider circuit, including, third and fourth mixers for mixing outputs of the divider with oscillation signals, of which phases are shifted for 90 degrees and of which frequency is lower than that of the outputs of the divider, first and second analog to digital converters for converting outputs of the third and fourth mixers, respectively, and a second phase shift circuit for shifting the phase of an output of the second analog to digital convertor for 90 degrees, wherein outputs of the third mixer and the second phase shift circuit are respectively inputted to the linearizing circuit as Ich and Qch orthogonal signals and compared with the sending signal.

23. A base station for radio communication comprising:

a sending and receiving antenna;

a high-frequency power amplifier for amplifying a sending signal to be sent from the sending and receiving antenna;

a linearizing circuit provided on the input side of the high-frequency power amplifier, for compensating an amplitude and a phase of the sending signal so as to reduce a difference obtained by comparing an input signal and the output of high-frequency power amplifier;

a circuit for obtaining the difference between the input signal and the output of the high-frequency power amplifier; and a directional coupler for coupling the output of the circuit to the output of the high-frequency power amplifier.

24. The base station according to claim 20, wherein the linearizing circuit includes;

first means for obtaining an error signal between the input signal of the high-frequency power amplifier, which is the sending signal, and the output signal of the high-frequency power amplifier;

second means for generating a compensating coefficient to compensate components of distortion characteristics of the high-frequency power amplifier based on the error signal according to an adaptive type algorithm;

third means for outputting the generated compensating coefficients corresponding to the input signal; and fourth means for multiplying the compensating coefficient, which is outputted corresponding to the input signal, with the input signal, and inputting the input signal multiplied with the compensating coefficient to the high-frequency power amplifier.

25. The base station according to claim 21, wherein the linearizing circuit includes;

first means for obtaining an error signal between the input signal of the high-frequency power amplifier, which is the sending signal, and the output signal of the high-frequency power amplifier;

second means for generating a compensating coefficient to compensate components of distortion characteristics of the high-frequency power amplifier based on the error signal according to an adaptive type algorithm;

third means for outputting the generated compensating coefficients corresponding to the input signal; and fourth means for multiplying the compensating coefficient, which is outputted corresponding to the input signal, with the input signal, and inputting the input signal multiplied with the compensating coefficient to the high-frequency power amplifier.

26. The base station according to claim 22, wherein the linearizing circuit includes;

first means for obtaining an error signal between the input signal of the high-frequency power amplifier, which is the sending signal, and the output signal of the high-frequency power amplifier;

second means for generating a compensating coefficient to compensate components of distortion characteristics of the high-frequency power amplifier based on the error signal according to an adaptive type algorithm;

third means for outputting the generated compensating coefficients corresponding to the input signal; and fourth means for multiplying the compensating coefficient, which is outputted corresponding to the input signal, with the input signal, and inputting the input signal multiplied with the compensating coefficient to the high-frequency power amplifier.

27. The base station according to claim 23, wherein the linearizing circuit includes;

first means for obtaining an error signal between the input signal of the high-frequency power amplifier, which is the sending signal, and the output signal of the high-frequency power amplifier;

second means for generating a compensating coefficient to compensate components of distortion characteristics of the high-frequency power amplifier based on the error signal according to an adaptive type algorithm;

third means for outputting the generated compensating coefficients corresponding to the input signal; and fourth means for multiplying the compensating coefficient, which is outputted corresponding to the input signal, with the input signal, and inputting the input signal multiplied with the compensating coefficient to the high-frequency power amplifier.

28. The base station according to claim 24, wherein a most significant bit, which is a maximum output voltage of the first and second digital to analog convertors, is set on a value immediately before a characteristics and life of the high-frequency power amplifier are not compensated.

29. The base station according to claim 24, further comprising:

an intermittent-operation controller for transmitting the output of the analog to digital convertor which converts the output of the high-frequency power amplifier to a digital signal to the linearizing circuit, periodically.

30. The base station according to claim 24, further comprising:

a first speed convertor for converting speed of an output of the analog to digital convertor which converts the output of the high-frequency signal to a digital signal, to low speed;

a second speed convertor for converting speed of an output of the first speed convertor back to an original speed; and an optical fiber or a micro wave fiber provided between the first and second speed convertors.

31. The base station according to claim 30, wherein the first and second speed convertors are formed of FIFO (First-In First-Out) memories.

32. The base station according to claim 24, wherein the high-frequency power amplifier is positioned in an advanced base station close to the sending antenna, and an analog optical transmission path is provided between the advanced base station side and the linearizing circuit side.

33. The base station according to claim 24, wherein the high-frequency power amplifier is positioned in an advanced base station close to the sending antenna, and a digital optical transmission path is provided between the advanced base station side and the linearizing circuit side.

34. The base station according to claim 33, wherein an operation of the analog to digital convertor for converting an output of the high-frequency power amplifier to a digital signal is performed intermittently for a short interval, and the digital optical transmission path feeds back the output of the analog to digital convertor to the linearizing circuit with low speed.

35. The base station according to claim 33, wherein the digital optical transmission path includes N optical transmission fibers, and transmission speed of each of the N optical transmission fibers is lowered as much as 1/N.

36. The base station according to claim 24, further comprising:

a group modulator for generating a signal modulated with multi-carriers for a plurality of channels in lump-sum, and the modulated signal is sent out as the sending signal.

37. The base station according to claim 36, wherein a digital filter is provided on an output side of the group modulator, for preventing from outputting the signal, of which output level exceeds the maximum output voltage of the digital to analog convertor to suppress clipping noise.

38. The base station according to claim 37, further comprising:

a level detector for monitoring an output of the group modulator and detecting condition, in which the amplitude level exceeds a maximum output voltage of the digital to analog convertor; and a controller for controlling to reduce each amplitude of the carriers for the plurality of channels according to the detected level of the level detector.

39. The base station according to claim 24, wherein the linearizing circuit includes a RAM for storing data which gives pre-distortion, and an external volatile memory to store data giving the pre-distortion obtained by test operating in advance and to transfer the data stored therein to the RAM before operation.

40. The base station according to claim 39, wherein the content stored in the RAM immediately before disconnecting power after actual operation is transferred and stored in the non-volatile memory.

41. The base station according to claim 24, wherein a linearizing circuit is positioned in an advanced base station side having the sending antenna, and the digital sending signal is transmitted to the advanced base station by the digital optical fiber transmission path or a micro wave transmission path.

42. The base station according to claim 41, wherein upward signals are transmitted to a base station by an analog optical fiber transmission path or a micro wave transmission path.

43. The base station according to claim 41, wherein the micro wave transmission path is a 4 to 8 GHz super high frequency wave path, a 8 to 40 GHz submillimeter wave channel, or a 40 to 80 GHz millimeter wave path.

* * * * *